(12) United States Patent
Goto et al.

(10) Patent No.: US 8,887,029 B2
(45) Date of Patent: Nov. 11, 2014

(54) WIRELESS COMMUNICATION SYSTEM, COMMUNICATION DEVICE, PROGRAM, AND INTEGRATED CIRCUIT

(75) Inventors: Jungo Goto, Osaka (JP); Yasuhiro Hamaguchi, Osaka (JP); Kazunari Yokomakura, Osaka (JP); Osamu Nakamura, Osaka (JP); Hiroki Takahashi, Osaka (JP); Shinsuke Ibi, Suita (JP); Seiichi Sampei, Suita (JP); Shinichi Miyamoto, Suita (JP)

(73) Assignees: Sharp Kabushiki Kaisha, Osaka (JP); Osaka University, Osaka (JP)

( * ) Notice: Subject to any disclaimer, the term of this patent is extended or adjusted under 35 U.S.C. 154(b) by 165 days.

(21) Appl. No.: 13/580,339

(22) PCT Filed: Feb. 22, 2011

(86) PCT No.: PCT/JP2011/053771
§ 371 (c)(1),
(2), (4) Date: Aug. 21, 2012

(87) PCT Pub. No.: WO2011/102521
PCT Pub. Date: Aug. 25, 2011

(65) Prior Publication Data
US 2012/0324308 A1  Dec. 20, 2012

(30) Foreign Application Priority Data
Feb. 22, 2010  (JP) ............... P2010-036479

(51) Int. Cl.
*H03M 13/00* (2006.01)
*H04L 1/00* (2006.01)
*H03M 13/29* (2006.01)

(52) U.S. Cl.
CPC ............ *H04L 1/005* (2013.01); *H04L 1/0009* (2013.01); *H03M 13/296* (2013.01)
USPC ........... 714/774; 714/755; 714/786; 714/794; 714/795; 714/796

(58) Field of Classification Search
CPC ............ H03M 13/03; H03M 13/296; H03M 13/2963; H03M 13/3988; H04L 1/0009; H04L 1/0071; H04L 1/0059; H04B 7/264
USPC ............... 714/755, 786, 774, 794, 795, 796
See application file for complete search history.

(56) References Cited

U.S. PATENT DOCUMENTS

| | | | |
|---|---|---|---|
| 6,892,335 B2 | 5/2005 | Gueguen | |
| 7,076,720 B1 * | 7/2006 | Yoshida et al. | ............... 714/755 |

(Continued)

FOREIGN PATENT DOCUMENTS

| | | | | |
|---|---|---|---|---|
| JP | 2001-28548 A | | 1/2001 | |
| JP | 2001028548 | * | 1/2001 | ............. G11B 20/18 |

(Continued)

OTHER PUBLICATIONS

Vladimir D. Trajkovi et al., "Near-Capacity Turbo Equaliztion Using Optimized Turbo Codes", Dec. 5, 2007, Australian Networks Conference, pp. 480-484.*

(Continued)

*Primary Examiner* — John Trimmings
(74) *Attorney, Agent, or Firm* — Birch, Stewart, Kolasch & Birch, LLP

(57) ABSTRACT

A communication device includes a turbo encoding section including a plurality of component encoders, wherein the plurality of component encoders within the turbo encoding section use different constraint lengths.

11 Claims, 16 Drawing Sheets

(56) References Cited

U.S. PATENT DOCUMENTS

| | | | |
|---|---|---|---|
| 7,093,186 B2* | 8/2006 | Kim et al. | 714/790 |
| 7,974,372 B2 | 7/2011 | Yoshida | |
| 8,607,130 B2* | 12/2013 | Cheng | 714/786 |
| 2002/0172292 A1* | 11/2002 | Gray | 375/259 |
| 2003/0005384 A1 | 1/2003 | Itakura | |
| 2003/0026346 A1* | 2/2003 | Matsumoto et al. | 375/262 |
| 2003/0128674 A1* | 7/2003 | Kong et al. | 370/320 |
| 2003/0131304 A1* | 7/2003 | Li | 714/755 |
| 2007/0101232 A1* | 5/2007 | Kim et al. | 714/755 |
| 2010/0287453 A1* | 11/2010 | Balachandran et al. | 714/790 |
| 2011/0044377 A1 | 2/2011 | Ibi et al. | |
| 2011/0206021 A9* | 8/2011 | Hansen et al. | 370/338 |
| 2011/0212743 A1 | 9/2011 | Yokomakura et al. | |

FOREIGN PATENT DOCUMENTS

| | | |
|---|---|---|
| JP | 2002-359563 A | 12/2002 |
| JP | 2003-6993 A | 1/2003 |
| JP | 2006-325063 A | 11/2006 |
| WO | WO 2009/022709 A1 | 2/2009 |
| WO | WO 2009/131156 A1 | 10/2009 |

OTHER PUBLICATIONS

Berrou et al., "Near Shannon Limit Error—Correcting Coding and Decoding: Turbo-Codes" in Proc. ICC'93, May 1993, pp. 1064-1070.

Douillard et al., "Iterative Correction of Intersymbol Interference: Turbo-Equalization", European Trans. Telecommunications and Related Technologies, vol. 6, No. 5, Sep.-Oct. 1995, pp. 507-511.

International Search Report for PCT/JP2011/053771 dated May 10, 2011.

Takeshita et al., "A Note on Asymmetric Turbo-Codes", IEEE Communications Letters, vol. 3, No. 3, Mar. 1999, pp. 69-71.

Vladimir D. Trajkovi, Minyue Fu, Peter J. Schreier, "Near-capacity Turbo Equalization Using Optimized Turbo Codes", Telecommunication Networks and Applications Conference, 2007. ATNAC 2007. Australasian, Dec. 5, 2007, pp. 480-484.

* cited by examiner

WIRELESS COMMUNICATION SYSTEM, COMMUNICATION DEVICE, PROGRAM, AND INTEGRATED CIRCUIT

TECHNICAL FIELD

The present invention relates to a wireless communication system, a communication device, a program, and an integrated circuit.

This application is based upon and claims the benefit of priority from prior Japanese Patent Application No. 2010-036479, filed Feb. 22, 2010, the entire contents of which are incorporated herein.

BACKGROUND ART

Recently, active research has been conducted on a method of efficiently utilizing a radio frequency (RF), which is a limited resource, in a mobile communication system. In wireless communication, an error occurs in transmitted information due to thermal noise of a receiver and/or frequency selective fading, and frequency utilization efficiency is degraded by the error. As an error-correcting method of correcting the error due to the thermal noise in a receiver, a convolutional code such as a non-systematic convolutional (NSC) code or a recursive systematic convolutional (RSC) code, a low density parity check (LDPC) code, a turbo code, which is a parallel concatenation of RSC codes, and the like are used (see Non-Patent Document 1). In particular, encoders for generating RSC codes, which are component encoders (RSC encoders), are concatenated in parallel via an interleaver to perform turbo encoding in an encoding section of a transmitter when the turbo code is used. On the other hand, it is possible to achieve characteristics close to a Shannon limit by performing turbo decoding in which an iterative decoding process is performed in a decoding section of the receiver. Here, the turbo code is used in an encoding scheme for independently performing encoding in each RSC encoder by providing a plurality of RSC encoders in an encoder and applying an interleaver to information bits to be encoded.

As a technique of compensating for frequency selective fading, a technique of a frequency-domain equalization process is generally used. For example, there is a technique based on a minimum mean square error (MMSE) criteria or the like.

Further, the improvement of reception characteristics by turbo equalization technology (see Non-Patent Document 2) in which an iterative decoding technique used for a turbo code is applied to an equalizer and a decoding section has also been studied. In general, it is possible to eliminate the effect of inter symbol interference (ISI) as much as possible by iterating an inner code and an outer code as which the convolution of transmission signals and impulse responses, and constraint of information bits by error correcting encoding are respectively regarded in single carrier transmission. In addition, the use of a turbo code which is capable of obtaining good reception characteristics is being studied as an error-correcting code for use in turbo equalization (see Patent Document 1). Here, the turbo equalization is a technique of detecting a signal by exchanging external information by iterative processes of a maximum a posteriori (MAP) detector and a decoder based on the turbo principle. A MAP detector for a single carrier is a soft canceller that cancels a replica of ISI fed back from the decoder, inter-user interference, inter-cell interference, inter-antenna interference, or the like, and is used for frequency-domain equalization. The MAP detector is also applicable to multi-carrier. In this case, the MAP detector becomes a soft canceller that cancels a replica of inter-code interference, inter-carrier interference, or the like.

On the other hand, there is multiple-input multiple-output (MIMO) transmission of multi-antenna technology as transmission technology that improves frequency utilization efficiency.

In addition, there is technology in which a spectrum, which is an applicable frequency-spread signal, is allowed to be allocated to a partially overlapping frequency range when the number of reception antennas of a receiver is less than the number of transmission antennas, and the receiver detects a signal by turbo equalization, which is iterative equalization technology (see Patent Document 2).

PRIOR ART DOCUMENTS

Patent Documents

Patent Document 1: Japanese Patent Application Publication No. 2006-325063
Patent Document 2: International Patent Application Publication No. WO 2009/022709

Non-Patent Documents

Non-Patent Document 1: C. Berrou, A. Glavieux, and P. Thitimajshima, "Near Shannon limit error-correcting coding and decoding: turbo-codes", in Proc. ICC '93, Geneva, Switzerland, May 1993, pp. 1064-1070
Non-Patent Document 2: C. Douillard, M. Jezequel, C. Berrou, A. Picart, P. Didier, A. Glavieux, "Iterative Correction of Intersymbol Interference: Turbo-Equalization", European Trans. Telecommunications and Related Technologies, vol. 6, no. 5, pp. 507-511, September-October 1995

DISCLOSURE OF INVENTION

Problem to be Solved by the Invention

However, there is a problem in that convergence characteristics of an iterative process are bad and error-rate characteristics of signal detection are significantly degraded when an error-correcting code to be used for an iterative process/equalization such as turbo equalization is designated as a turbo code under a communication environment in which interference is high.

The present invention provides a wireless communication system, a communication device, a program, and an integrated circuit, which can further increase reliability of communication in a communication system using a turbo code as an error-correcting code.

Means to Solve the Problem (1) A first aspect of the present invention is a wireless communication system including a first communication device and a second communication device, wherein the first communication device includes: a turbo encoding section that configures a plurality of component encoders of different constraint lengths in the different constraint lengths in case that the second communication device performs a signal reception process by turbo equalization.

(2) In the first aspect of the present invention, in case that the first communication device transmits information bits as a transmission signal to the second communication device, the first communication device may insert a plurality of error-correcting codes into the information bits by the turbo encoding section including the plurality of component encoders configured to generate the error-correcting codes, and generate the transmission signal by encoding the information bits into which the error-correcting codes have been inserted.

(3) In the first aspect of the present invention, the turbo encoding section may compare communication parameters set by the second communication device according to propagation characteristics of a signal received from the first communication device to condition values that deteriorate convergence characteristics of an iterative process in the turbo equalization set for the communication parameters, and the plurality of component encoders may be configured in the different constraint lengths according to comparison results.

(4) In the first aspect of the present invention, the constraint length of one of the plurality of component encoders constituting the turbo encoding section may be changed.

(5) In the first aspect of the present invention, the constraint lengths of the plurality of component encoders may be set to be different.

(6) In the first aspect of the present invention, in case that one of the communication parameters corresponds to the condition value that deteriorates the convergence characteristics of the iterative process in the turbo equalization, the constraint length of one component encoder within the turbo encoding section may be changed.

(7) In the first aspect of the present invention, in case that the second communication device allows an overlapping allocated band to a plurality of first communication devices and performs a decoding process for the received transmission signal by the iterative process in the turbo equalization, the second communication device may determine control information including allocated frequency bands for every plurality of first communication devices, an encoding rate, number of modulation order of a modulation symbol, and the number of reception antennas to be used by the second communication device, the second communication device may report all or some of the communication parameters including the control information and overlapping rates of overlapping bands allocated for every plurality of first communication devices to the first communication device, and the first communication device may perform encoding using the turbo encoding section in which the plurality of component encoders are configured in the different constraint lengths by comparing the reported communication parameters to the condition values that deteriorate the convergence characteristics of the iterative process in the turbo equalization.

(8) In the first aspect of the present invention, in case that the second communication device determines allocated bands for every plurality of transmission antennas provided in the first communication device, the second communication device may allow an overlapping allocated band to the plurality of transmission antennas, and perform a reception process by a turbo equalization process, the second communication device may determine control information including allocated frequency bands for every plurality of transmission antennas, an encoding rate, and number of modulation order of a modulation symbol, the second communication device may report all or some of the communication parameters including the control information, overlapping rates of overlapping bands allocated to the plurality of transmission antennas, and the number of reception antennas to the first communication device, and the first communication device may perform encoding using the turbo encoding section in which the plurality of component encoders are configured in the different constraint lengths by comparing the reported communication parameters to the condition values that deteriorate the convergence characteristics of the iterative process in the turbo equalization.

(9) In the first aspect of the present invention, in case that the second communication device allows an overlapping allocated band to the plurality of first communication devices, and performs a reception process by a turbo equalization process, the second communication device may determine control information including allocated bands for every plurality of first communication devices, an encoding rate, and number of modulation order, the second communication device may determine the constraint lengths of the component encoders of the turbo encoding section in the first communication device by comparing all or some of the communication parameters including the control information, an overlapping rate of an overlapping band allocated to the plurality of first communication devices, and the number of reception antennas to be used by the second communication device to the condition values that deteriorate the convergence characteristics of the iterative process in the turbo equalization with the corresponding communication parameters, and report information regarding the constraint lengths to the first communication device, and the first communication device may change the constraint lengths of the component encoders in the turbo encoding section.

(10) In the first aspect of the present invention, in case that the second communication device determines allocated bands for every plurality of transmission antennas provided in the first communication device, allows an overlapping allocated band to the plurality of transmission antennas, and performs a reception process by a turbo equalization process, the second communication device may determine control information including the allocated bands for every plurality of transmission antennas, an encoding rate, and number of modulation order, the second communication device may determine the constraint lengths of the component encoders of the turbo encoding section in the first communication device by comparing all or some of the communication parameters including the control information, an overlapping rate of an overlapping band allocated to the plurality of transmission antennas, and the number of reception antennas to the condition values that deteriorate the convergence characteristics of the iterative process in the turbo equalization with the corresponding communication parameters, and reports information regarding the constraint lengths to the first communication device, and the first communication device may change the constraint lengths of the component encoders in the turbo encoding section.

(11) In the first aspect of the present invention, in case that the first communication device transmits a spatially multiplexed signal to the second communication device using a plurality of transmission antennas, and the second communication device performs separation of the spatially multiplexed signal using a plurality of reception antennas and a reception process by the turbo equalization, the second communication device may determine control information including allocated bands for every plurality of transmission antennas, an encoding rate, and number of modulation order, the second communication device may determine the constraint lengths of the component encoders of the turbo encoding section in the first communication device by comparing all or some of the communication parameters including the control information, a correlation value between antennas calculated from propagation channel estimation for every plurality of antennas, and the number of reception antennas to be used by the second communication device to the condition values that deteriorate the convergence characteristics of the iterative process in the turbo equalization with the corresponding communication parameters, and reports information regarding the constraint lengths to the first communication device, and the first communication device may change the constraint lengths of the component encoders in the turbo encoding section according to the information regarding the constraint lengths.

(12) In the first aspect of the present invention, in case that the first communication device transmits a spatially multiplexed signal to the second communication device using a plurality of transmission antennas, and the second communication device performs separation of the spatially multiplexed signal using a plurality of reception antennas and a reception process by turbo equalization, the second communication device may determine control information including allocated bands for every plurality of transmission antennas, an encoding rate, number of modulation order, a correlation value between antennas calculated from propagation channel estimation for every plurality of antennas, and the number of reception antennas, and transmit the control information to the first communication device, and the first communication device may determine the constraint lengths of the component encoders of the turbo encoding section by comparing all or some parameters of the control information to the condition values that deteriorate the convergence characteristics of the iterative process in the turbo equalization with the corresponding communication parameters, and the plurality of component encoders in the turbo encoding section may use the different constraint lengths.

(13) In the first aspect of the present invention, in case that an encoding rate is greater than a predetermined value, the constraint lengths of the component encoders of the encoding section may be changed.

(14) In the first aspect of the present invention, the second communication device may determine control information including allocated bands for every plurality of transmission antennas, an encoding rate, and number of modulation order, and the second communication device may determine the constraint lengths of the component encoders of the turbo encoding section in the second communication device by comparing all or some of communication parameters including the control information, a correlation value between antennas calculated from propagation channel estimation for every plurality of antennas, and the number of reception antennas to the condition values that deteriorate the convergence characteristics of the iterative process in the turbo equalization with the corresponding communication parameters, and reports information regarding the constraint lengths to the first communication device.

(15) A second aspect of the present invention is a communication device including: a turbo encoding section including a plurality of component encoders, wherein the plurality of component encoders within the turbo encoding section use different constraint lengths.

(16) In the second aspect of the present invention, in case that information bits are transmitted as a transmission signal to another communication device, a plurality of error-correcting codes may be inserted into the information bits by the turbo encoding section including the plurality of component encoders configured to generate the error-correcting codes, and the transmission signal may be generated by encoding the information bits into which the error-correcting codes have been inserted.

(17) In the second aspect of the present invention, in case that one of the communication parameters corresponds to a condition value that deteriorates convergence characteristics of an iterative process in turbo equalization, the constraint length of one component encoder within the turbo encoding section may be changed.

(18) In the second aspect of the present invention, in case that the other communication device allows an overlapping allocated band to the plurality of communication devices and performs a reception process by a turbo equalization process, the plurality of component encoders within the turbo encoding section may have the different constraint lengths.

(19) In the second aspect of the present invention, in case that the other communication device determines allocated bands for every plurality of transmission antennas provided in the communication device, allows an overlapping allocated band to the plurality of transmission antennas, and performs a reception process by a turbo equalization process, the plurality of component encoders within the turbo encoding section may have the different constraint lengths.

(20) In the second aspect of the present invention, communication parameters set by the other communication device may be compared to condition values, which deteriorate convergence characteristics of an iterative process in turbo equalization in the communication device, set for the communication parameters according to propagation characteristics of a signal received from the other communication device, and the constraint lengths of the component encoders may be changed according to comparison results.

(21) In the second aspect of the present invention, the constraint length of one of two component encoders within the turbo encoding section may be set to 3, and the constraint length of the other may be set to 4.

(22) In the second aspect of the present invention, all or some communication parameters including band allocation information, a modulation scheme, an encoding rate, an overlapping rate of the band, a correlation value between antennas, and the number of reception antennas may be reported from the other communication device, the constraint lengths of the component encoders in the turbo encoding section may be determined based on information regarding the reported communication parameters, and turbo encoding may be performed.

(23) A third aspect of the present invention is a computer-readable program for causing a computer to execute a process of controlling a communication device, wherein the communication device configures a plurality of component encoders of different constraint lengths in the different constraint lengths in case that another communication device performs a reception process of a signal by turbo equalization.

(24) In the third aspect of the present invention, the constraint lengths of the component encoders within a turbo encoding section may be determined based on information regarding all or some communication parameters including band allocation information, a modulation scheme, an encoding rate, an overlapping rate of the band, a correlation value between antennas, and the number of reception antennas reported from the other communication device, and turbo encoding may be performed.

(25) In the third aspect of the present invention, control information including allocation information of bands for the other communication device, a modulation scheme, and an encoding rate, an overlapping rate of the band in the control information, a correlation value between antennas, and the number of reception antennas of the communication device may be set as communication parameters, and the communication device may transmit the communication parameters as information that determines the constraint lengths of the component encoders within a turbo encoding section to the other communication device.

(26) In the third aspect of the present invention, control information including allocation information of bands for the other communication device, a modulation scheme, and an encoding rate, an overlapping rate of the band between the devices in the control information, a correlation value between antennas, and the number of reception antennas of the communication device may be set as communication parameters, the constraint lengths of the component encoders within a turbo encoding section in the other communication device may be obtained, and the obtained constraint lengths may be transmitted to the other communication device.

(27) A fourth aspect of the present invention is an integrated circuit of a communication device, wherein the communication device configures a plurality of component encoders of different constraint lengths in the different constraint lengths in case that another communication device performs a reception process of a signal by turbo equalization.

(28) In the fourth aspect of the present invention, in case that the communication device transmits information bits as a transmission signal to the other communication device, the other communication device may insert a plurality of error-correcting codes into the information bits by the turbo encoding section including the plurality of component encoders configured to generate the error-correcting codes, and generate the transmission signal by encoding the information bits into which the error-correcting codes have been inserted, and the plurality of component encoders within the turbo encoding section may use the different constraint lengths.

(29) In the fourth aspect of the present invention, in case that the other communication device transmits information bits as a transmission signal to the communication device, the communication device may insert a plurality of error-correcting codes into the information bits by the turbo encoding section including the plurality of component encoders configured to generate the error-correcting codes, and generate the transmission signal by encoding the information bits into which the error-correcting codes have been inserted, the communication device may determine control information including allocated bands for every plurality of transmission antennas, an encoding rate, and number of modulation order, and the communication device may determine the constraint lengths of the component encoders of the turbo encoding section in the other communication device by comparing all or some communication parameters including the control information, a correlation value between antennas calculated from propagation channel estimation for every plurality of antennas, and the number of reception antennas to condition values that deteriorate convergence characteristics of an iterative process in turbo equalization with the corresponding communication parameters, and report information regarding the constraint lengths to the other communication device.

Effect of the Invention

According to the present invention, it is possible to further increase reliability of communication and improve frequency utilization efficiency as compared to conventional techniques by changing an encoding constraint length in a component encoder according to an encoding rate, a modulation scheme, band allocation information, and an overlapping rate of band allocation with other transmitting devices in a communication system using a turbo code as an error-correcting code.

BEST MODE FOR CARRYING OUT THE INVENTION

First Embodiment

Figure 1:
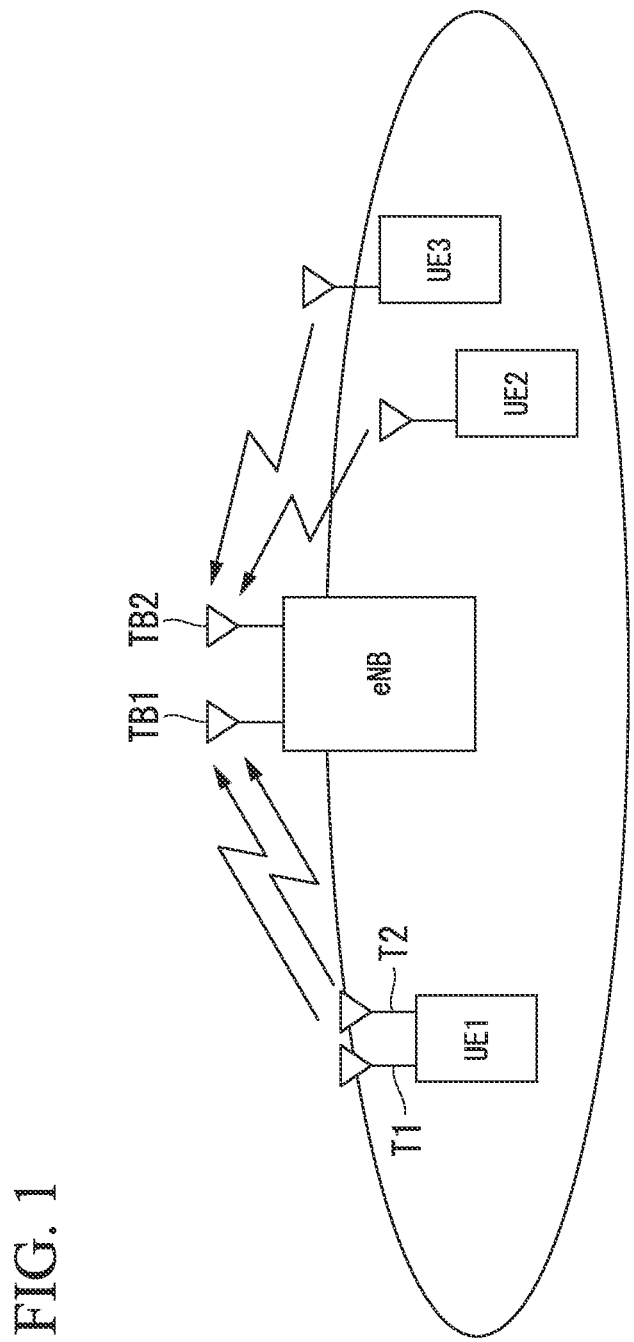
FIG. 1 is a conceptual diagram illustrating a configuration example of a wireless communication system according to a first embodiment of the present invention.

Hereinafter, embodiments of the present invention will be described with reference to the drawings. FIG. 1 is a conceptual diagram of a wireless communication system according to the first embodiment of the present invention.

In FIG. 1, a base station device eNB mutually performs wireless communication with a plurality of terminal devices UE1, UE2, and UE3 using downlink and uplink. Each of the base station device eNB and the plurality of terminal devices UE1, UE2, and UE3 is a device having a function of a transceiver. However, in description of the following embodiments, the case in which each of the plurality of terminal devices UE1, UE2, and UE3 transmits a data signal to the base station device eNB through the uplink will be described. Thus, in the meaning of a receiving side and a transmitting side of the data signal, the terminal device is referred to as a transmitting device and the base station device eNB is referred to as a receiving device. Therefore, although the case in which the transmitting device is referred to as a transmitting section of the terminal device and the receiving device is referred to as a receiving section of the base station device is included, the present invention is not limited thereto.

Here, the terminal device UE1 performs MIMO transmission using the same frequency spatially multiplexed using two transmission antennas T1 and T2. On the other hand, the terminal devices UE2 and UE3 perform data transmission by single transmission antenna. For the number of antennas to be used by the terminal devices UE1, UE2, and UE3 for data transmission, the number of antennas for use in transmission, or band allocation is determined by the base station device eNB from a propagation channel situation, and the determination result is reported to the terminal devices UE1, UE2, and UE3.

Figure 2:
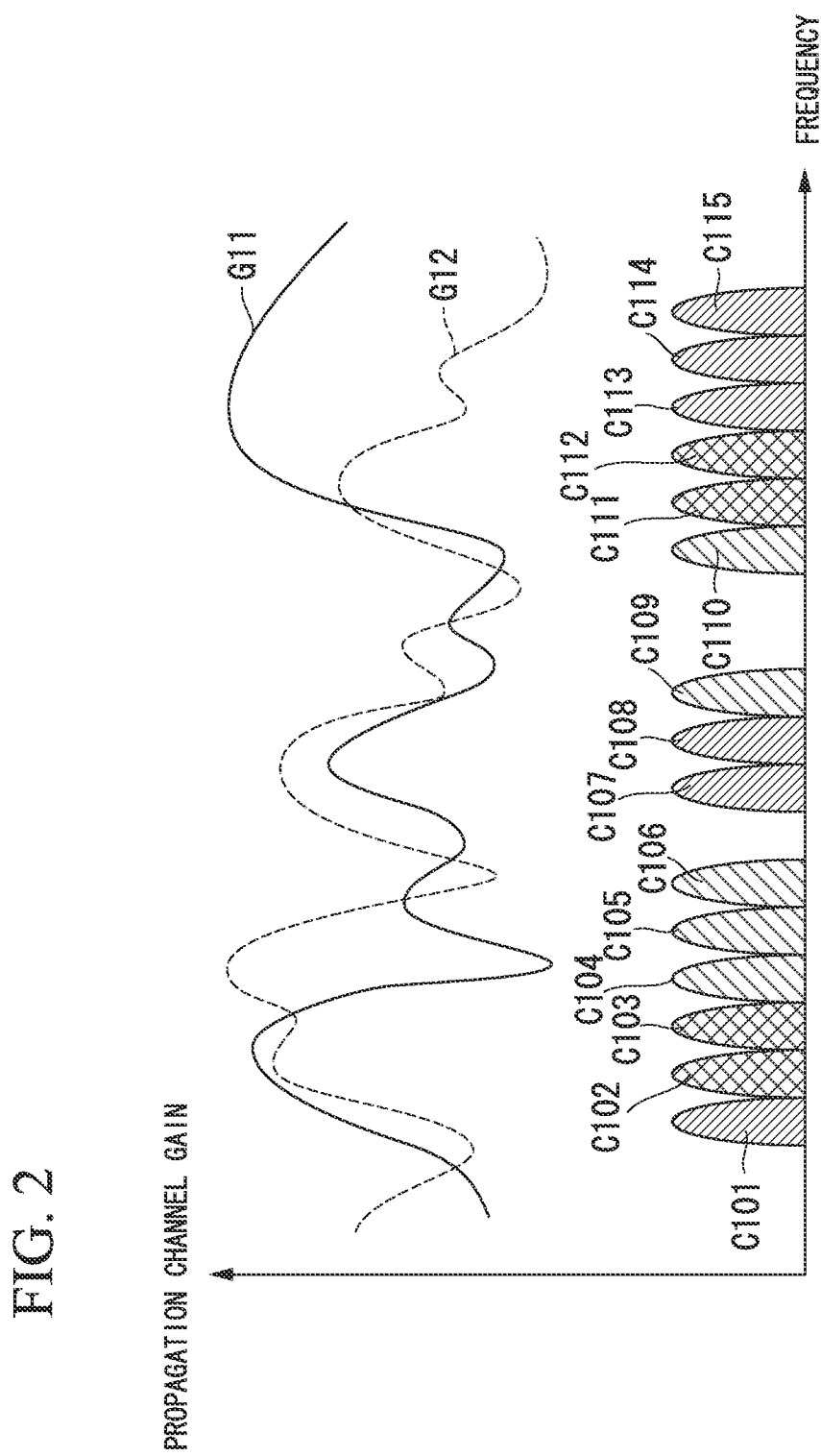
FIG. 2 is a diagram illustrating an example of non-contiguous allocation of a band for use in transmission when terminal devices UE2 and UE3 transmit data to a base station device eNB.

In the wireless communication system of FIG. 1, the base station device eNB can allocate non-contiguous bands to the terminal devices UE2 and UE3. FIG. 2 illustrates an example of allocation of non-contiguous bands to the terminal devices UE2 and UE3. In FIG. 2, the horizontal axis represents a frequency. Peak shapes C101, C107, C108, C113, C114, and C115 hatched with diagonal lines from the top left to the bottom right, and peak shapes C102, C103, C111, and C112 hatched with diagonal crossed lines from the top left to the bottom right and from the top right to the bottom left indicate subcarriers allocated to the terminal device UE2, which is a user terminal. Peak shapes C104, C105, C106, C109, and C110 hatched with diagonal lines from the top right to the bottom left and the peak shapes C102, C103, C111, and C112 hatched with the diagonal crossed lines from the top left to the bottom right and from the top right to the bottom left represent subcarriers allocated to the terminal device UE3, which is a user terminal. Therefore, the peak shapes C102, C103, C111, and C112 hatched with the diagonal crossed lines from the top left to the bottom right and from the top right to the bottom left represent subcarriers allocated to both the terminal devices UE2 and UE3, that is, subcarriers allocated to a plurality of terminal devices. In addition, in the upper part of FIG. 2, the vertical axis represents propagation channel gain curves of propagation channels of the terminal devices UE2 and UE3 as propagation channel gains. That is, a curve G11 represents the propagation channel gain curve of the propagation channel of the terminal device UE2. In addition, a curve G12 represents the propagation channel gain curve of the propagation channel of the terminal device UE3. Although allocation to the terminal devices UE2 and UE3 is described in units of subcarriers in FIG. 2, an integer multiple of the number of subcarriers may be designated as a minimum unit of an allocation bandwidth. For example, 12 subcarriers may be designated as a resource block and allocation may be performed in units of resource blocks. In the example of FIG. 2, because the base station device eNB allocates subcarriers having high propagation channel gains to the terminal devices UE2 and UE3 instead of allocation of frequency division multiplexing (FDM) for two users, some subcarriers C102, C103, C111, and C112 are in overlapping allocation.

Next, the wireless communication system of the first embodiment will be described as an example of data transmission by a single carrier using the base station device eNB and the terminal devices UE2 and UE3 in the wireless communication system in FIG. 1.

Figure 3:
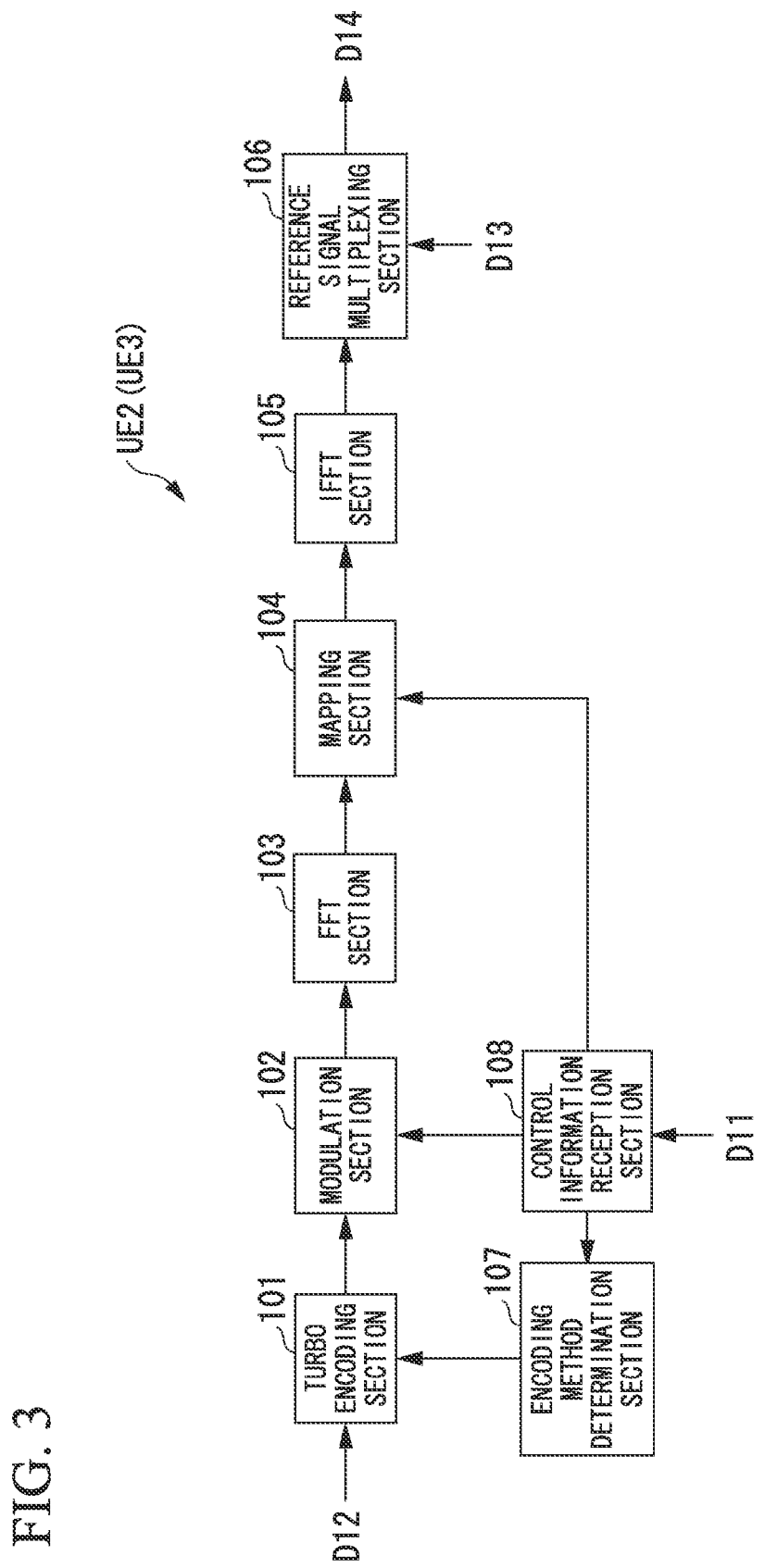
FIG. 3 is a block diagram illustrating a configuration example of the terminal devices UE2 and UE3 according to this embodiment.

A configuration of a transmitting device according to the first embodiment will be described using FIG. 3. FIG. 3 is a block diagram illustrating a configuration example of the terminal devices UE2 and UE3 according to this embodiment. Configurations of transmitting devices of the terminal devices UE2 and UE3 in this embodiment will be described. The terminal device UE2 has a turbo encoding section 101, a modulation section 102, a fast Fourier transform (FFT) section 103, a mapping section 104, an inverse fast Fourier transform (IFFT) section 105, a reference signal multiplexing section 106, an encoding method determination section 107, and a control information reception section 108. The terminal device UE3 has substantially the same configuration as the terminal device UE2.

In FIG. 3, the terminal device UE2 receives control information D11 reported from the receiving device of the base station device eNB using the control information reception section 108. Here, the control information received by the control information reception section 108 includes an encoding rate, a modulation scheme, band allocation information, an overlapping rate of band allocation with other transmitting devices, and the like. The control information reception section 108 outputs information such as the encoding rate, the modulation scheme, and the overlapping rate of the band included in the control information to the encoding method determination section 107. In addition, the control information reception section 108 outputs the modulation scheme included in the control information to the modulation section 102. In addition, the control information reception section 108 outputs the band allocation information to the mapping section 104.

Based on the reported encoding rate, the encoding method determination section 107 determines a puncturing pattern to be used by selecting one of a plurality of preset puncturing patterns. In addition, the encoding method determination section 107 determines information regarding an encoding constraint length based on the encoding rate, the modulation scheme, and the overlapping rate. The encoding method determination section 107 outputs the information regarding the determined puncturing pattern and encoding constraint length to the turbo encoding section 101. The encoding method determination section 107 associates and stores the encoding rate and the puncturing pattern. Here, the constraint length represents the number of bits that are convoluted with a convolutional code generated by an RSC encoder.

The turbo encoding section 101 encodes data bits D12 of the terminal device UE2 using information regarding encoding input from the encoding method determination section 107, and outputs the encoded bits to the modulation section 102.

The modulation section 102 generates a modulation symbol by modulating the input encoded bits according to the modulation scheme received from the control information reception section 108 among modulations of quadrature phase shift keying (QPSK), 16-ary quadrature amplitude modulation (16 QAM), and the like. Thereafter, the modulation section 102 outputs the modulation symbol to the FFT section 103.

Here, the number of bits constituting one modulation symbol is designated as number of modulation order. For example, one symbol includes 2 bits in QPSK, and includes 4 bits in 16QAM.

The FFT section 103 transforms the modulation symbol input from the modulation section 102 from time domain signals into frequency domain data signals, and outputs the data signals after the transform to the mapping section 104.

Based on band allocation information input from the control information reception section 108, the mapping section 104 performs a process of allocating the frequency-domain data signals to allocated bands, and outputs the allocated data signal to the IFFT section 105.

The IFFT section 105 transforms the frequency-domain data signals into time-domain signals, and outputs the transmission signals after the transform to the reference signal multiplexing section 106.

The reference signal multiplexing section 106 performs a process of multiplexing a reference signal D13 (a pilot signal in which a code pattern is known) with the transmission signal in the time domain, and outputs the multiplexed signal as a transmission signal D14 of the terminal device UE2.

Although omitted in FIG. 3, the transmission signal D14 is converted by digital/analog (D/A) conversion into an analog signal after a cyclic prefix (CP) is inserted, and then the analog signal is up-converted into an RF. The up-converted signal is transmitted from a transmission antenna after being amplified by a power amplifier (PA) to transmission power. Hereinafter, a process of transmitting a generated transmission signal is substantially the same, and description thereof is omitted.

In addition, according to signal processing that is substantially the same as in the terminal device UE2, the terminal device UE3 also generates and up-converts a transmission signal, and transmits the up-converted transmission signal from a transmission antenna after amplification by the PA to transmission power.

Although the reference signal multiplexing section 106 multiplexes the reference signal in the time domain in this embodiment, the mapping section 104 may be configured to multiplex the reference signal with the transmission signal in the frequency domain. In this case, the reference signal multiplexing section 106 becomes unnecessary.

Next, a configuration of the turbo encoding section 101 will be described using FIG. 4. Because the turbo encoding sections 101 and 701 are substantially the same as each other, the configuration of the turbo encoding section of FIG. 4 will be described as a representative configuration. The turbo encoding section 101 has an encoding section 201, a puncturing section 202, an interleaving section 203, an encoding section 204, and an encoded bit output section 205. Data D15 including information regarding puncturing patterns and constraint lengths is input from the encoding method determination section 107 to the turbo encoding section 101. Here, the information regarding the constraint lengths is designated by the encoding method determination section 107 as information regarding constraint lengths, which are each obtained for the encoding sections 201 and 204 within the turbo encoding section 101, based on information regarding the encoding rate and/or the overlapping rate and the modulation scheme.

The encoding section 201 performs RSC encoding of the constraint length reported for the data bits D12 (information bits), and outputs systematic bits D16, which are data bits, and parity bits D17 obtained by the RSC encoding. Here, the encoding section 201 outputs the systematic bits D16 to the code bit output section 205, and outputs the parity bits D17 to the puncturing section 202.

The interleaving section 203 interleaves the data bits while changing the order of the input data bits, and outputs the interleaved data bits to the encoding section 204.

The encoding section 204 performs RSC encoding of the interleaved data bits input from the interleaving section 203 according to the constraint length reported from the encoding method determination section 107.

Here, for a pattern of interleaving of the interleaving section 203, the same pattern is pre-retained in the turbo encoding section 101 and a decoding section in the base station device eNB. Thus, the encoding section 204 does not need to transmit systematic bits. Therefore, the encoding section 204 generates only parity bits, and outputs the generated parity bits to the puncturing section 202. Each of the above-described encoding sections 201 and 204 generates a different set of parity bits that are added to the systematic bits, which are information bits, as error-correcting codes.

The puncturing section 202 punctures the systematic bits D17 output from the encoding section 201 and the parity bits output from the encoding section 204 according to the data D15 including the information regarding the puncturing patterns and the constraint lengths reported from the encoding method determination section 107.

The same puncturing pattern is preset in the turbo encoding section 101 of the terminal device UE2 and the decoding section of the base station device eNB.

The code bit output section 205 concatenates the systematic bits D16 input from the encoding section 201 with parity bits D18 after the puncturing input from the puncturing section 202.

The turbo encoding section 101 outputs a bit stream in which the systematic bits D16 are concatenated with the parity bits D18 output from the puncturing section 202 as code bits D19.

Figure 5A:
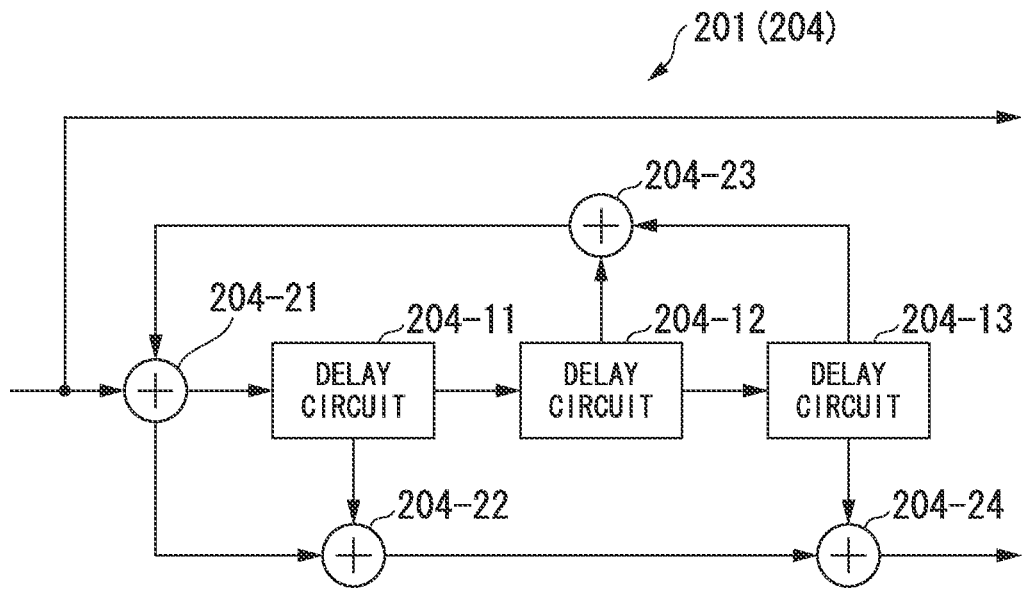
FIG. 5A is a block diagram illustrating a configuration example of an encoding section 201 or 204.
Figure 5B:
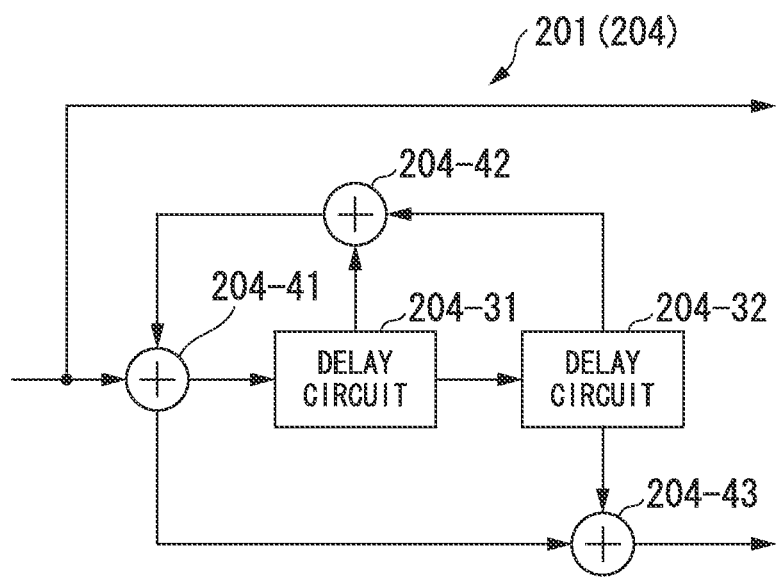
FIG. 5B is a block diagram illustrating another configuration example of the encoding section 201 or 204.

Next, FIGS. 5A and 5B are diagrams illustrating configuration examples of the encoding section 201 or 204. The configuration of FIG. 5A is illustrated as an example of the encoding section 201 (204) that performs RSC encoding in which a constraint length is 4. In addition, the configuration of FIG. 5B is illustrated as an example of the encoding section that performs RSC encoding in which a constraint length is 3. Here, the constraint length has a value obtained by adding 1 to the number of delay circuits from generating parity bits using input bits and bits retained in the delay circuits.

The encoding section 201 (204) of FIG. 5A includes delay circuits 204-11, 204-12, 204-13 and adders 204-21, 204-22, 304-23, and 204-24.

The encoding section 201 (204) of FIG. 5B includes delay circuits 204-31 and 204-32 and adders 204-41, 204-42, and 204-43.

Each of the encoding sections 201 and 204 controls connections of the delay circuits and the adders so that the number of convolutions on the data bits input in time series becomes the number of bits of the constraint length in correspondence with the constraint length input from the encoding method determination section 107 (FIG. 3). For example, when the constraint length in the encoding section 201 is changed from 4 to 3, the connections of the delay circuits and the adders are changed from FIG. 5A to FIG. 5B. Here, the constraint lengths of the encoding sections 201 and 204 may be set by numbers different from the start.

Figure 6:
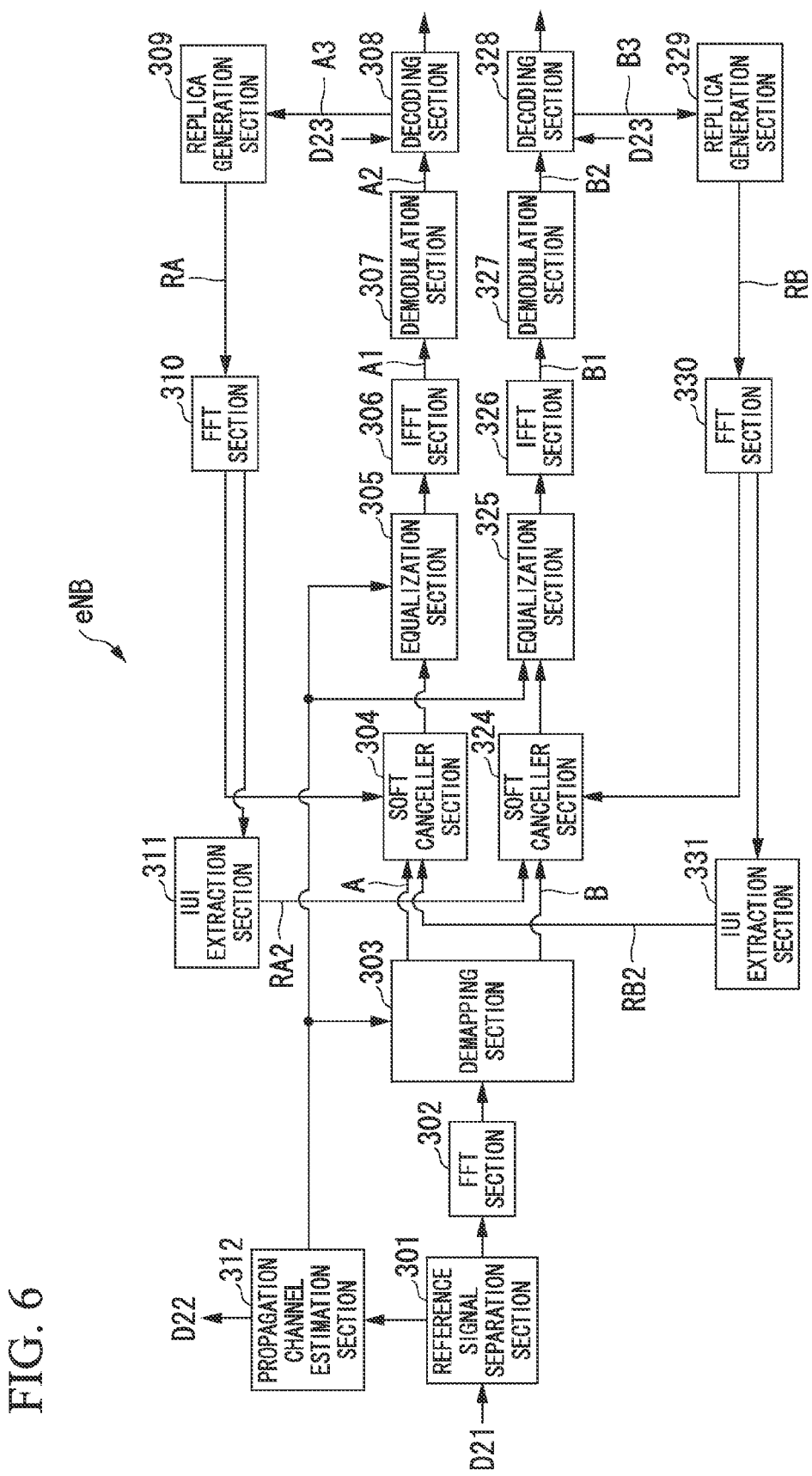
FIG. 6 is a block diagram illustrating a configuration example of a receiving device in the base station device eNB according to this embodiment.

Next, the base station device eNB according to this embodiment will be described using FIG. 6. FIG. 6 is a diagram illustrating a configuration example of the base station device eNB according to this embodiment in which the number of reception antennas is one.

In FIG. 6, the base station device eNB includes a reference signal separation section 301, an FFT section 302, a demapping section 303, a soft canceller section 304, an equalization section 305, an IFFT section 306, a demodulation section 307, a decoding section 308, a replica generation section 309, an FFT section 310, an inter user information (IUI) extraction section 311, a propagation channel estimation section 312, a soft canceller section 324, an equalization section 325, an IFFT section 326, a demodulation section 327, a decoding section 328, a replica generation section 329, an FFT section 330, and an IUI extraction section 331.

The reference signal separation section 301 simultaneously receives reception signals D21 from a plurality of transmitting devices (terminal devices) (from the terminal devices UE2 and UE3 in this embodiment) via a reception antenna TB1, and performs separation into encoded data and reference signals.

At this time, the reference signal separation section 301 down-converts the received reception signal D21 into a baseband signal, and converts the baseband signal into a digital signal according to A/D conversion.

In addition, after removing a CP from the digital signal, the reference signal separation section 301 separates the reference signal of each transmitting device, and outputs the separated reference signal to the propagation channel estimation section 312. In addition, the reference signal separation section 301 outputs the data signal from which the reference signal has been separated to the FFT section 302.

The propagation channel estimation section 312 estimates propagation channel characteristics of each of the plurality of transmitting devices from the input reference signal of each transmitting device, and outputs the estimated propagation channel characteristics to the demapping section 303 and the equalization section 305.

In addition, the propagation channel estimation section 312 sets band allocation (band allocation information), an encoding rate, a modulation scheme, and the like for each transmitting device according to the estimated propagation channel characteristics. At this time, because overlapping allocation is also allowed based on the propagation channel characteristics of each transmitting device when the band allocation is set, the propagation channel estimation section 312 sets the band allocation by including an overlapping rate of band allocation with other transmitting devices. Here, the overlapping rate is a ratio at which a plurality of transmitting devices are allocated to the same frequency in an allocated band. For example, when the number of transmitting devices is 2, 10 subcarriers are allocated to each transmitting device, and 5 subcarriers overlap, an overlapping rate becomes 0.5 (=5 subcarriers/10 subcarriers).

The propagation channel estimation section 312 converts control information including allocation information of a set band, an encoding rate, a modulation scheme, and an overlapping rate into a signal D22 for feedback, and transmits the signal D22 to the transmitting devices (the terminal devices UE2 and UE3) via a modulation section, a wireless section, and a transmission antenna (not illustrated). Here, the obtained control information is preset so that a predetermined error rate is obtained by experimentation and the like in correspondence with the propagation channel characteristics, and the control information stored in correspondence with the input propagation channel characteristics is output to the propagation channel estimation section 312. In addition, the propagation channel estimation section 312 obtains constraint lengths and puncturing patterns according to the above-described control information, and outputs the obtained constraint lengths and puncturing patterns to the decoding section 328.

The FFT section 302 transforms data signals from time-domain signals into frequency-domain signals, and outputs the frequency signals after the transform to the demapping section 303.

The demapping section 303 separates the frequency signal into signals from the transmitting devices according to band allocation information, which is internally stored mapping information upon previous transmission to the transmitting devices. That is, the demapping section 303 performs separation into a signal A from the terminal device UE2 and a signal B from the terminal device UE3.

The demapping section 303 outputs signals from the transmitting devices into which the frequency signal has been separated to different detection paths. In this embodiment, the demapping section 303 outputs the signal A into which the frequency signal has been separated to the soft canceller section 304 and outputs the signal B to the soft canceller section 324. Here, because the frequency signal is merely separated using the mapping information in this step, frequency signals of some allocation bands overlapping upon transmission remain as interference to each other.

The soft canceller section 304 subtracts soft replicas of ISI and IUI from a reception signal as a soft cancelling process for the separated signal A (a signal of a specific transmitting device) according to information regarding ISI, which is feedback information from the decoding section 308 to be described later, and information regarding IUI from the IUI extraction section 331 according to signal allocation by another transmitting device to an overlapping band. Thereby, the soft canceller section 304 performs a process of canceling ISI and IUI. Although ISI and IUI are simultaneously subtracted and canceled in this embodiment, a process of separately subtracting and canceling each of replicas of ISI and IUI may be performed.

In addition, the soft canceller section 304 outputs the signal A subjected to the soft cancellation to the equalization section 305.

However, in the first round, the soft canceller section 304 does not have feedback information and does not receive information regarding IUI from the IUI extraction section 331 according to signal allocation by another transmitting device to an overlapping band. Thus, the soft canceller section 304 does not perform a process of canceling ISI and IUI.

The equalization section 305 performs an equalization process of compensating for distortion of a radio propagation channel such as multiplying an MMSE weight according to propagation channel characteristics estimated by the propagation channel estimation section 312 for the signal A input from the soft canceller section 304, and outputs the signal A subjected to the equalization process to the IFFT section 306.

The IFFT section 306 transforms the signal A subjected to the equalization process input from the equalization section 305 from frequency-domain signals into time-domain signals, and outputs a processed signal A1 as the transform result to the demodulation section 307.

The demodulation section 307 performs a process of demodulating a modulation symbol for the processed signal A1 input from the IFFT section 306 in correspondence with a modulation method previously transmitted to the transmitting device, and outputs a demodulated signal A2 to the decoding section 308.

The decoding section 308 performs a decoding process by control information (encoding information D23) such as an encoding rate reported as control information to a transmitting device for the demodulated signal A2 input from the demodulating section 307, and outputs the decoding result as signal bits A3 to the replica generation section 309.

The replica generation section 309 re-converts decoded bits into a modulation symbol in correspondence with a modulation method previously transmitted to the transmitting device, and outputs the modulation symbol as a replica signal RA to the FFT section 310.

The FFT section 310 transforms the replica signal RA input from the replica generation section 309 from time-domain signals into frequency-domain signals. The FFT section 310 outputs the transform result as feedback information to the soft canceller section 304 and the IUI extraction section 311.

The soft canceller section 304 performs a process of canceling ISI from its own signal A according to the feedback information input from the FFT section 310.

The IUI extraction section 311 generates an IUI replica RA2 from the feedback information input from the FFT section 310, and outputs the IUI replica RA2 to the soft canceller section 324. In the soft canceller section 324, the interference replica RA2 is used for removal of IUI by the signal A from the signal B transmitted from another transmitting device, that is, the terminal device UE3.

In addition, the soft canceller section 324, the equalization section 325, the IFFT section 326, the demodulation section 327, the decoding section 328, the replica generation section 329, the FFT section 330, and the IUI extraction section 331 perform substantially the same processes as the soft canceller section 304, the equalization section 305, the IFFT section 306, the demodulation section 307, the decoding section 308, the replica generation section 309, the FFT section 310, and the IUI extraction section 311.

That is, the soft canceller section 324 performs a process of canceling ISI and IUI by a soft cancellation process for the separated signal B (a signal of a specific transmitting device) by feedback information from the decoding section 328 to be described later, and information regarding IUI caused by another transmitting device's signal allocation to overlapped band from the IUI extraction section 311.

In addition, the soft canceller section 324 outputs the signal B subjected to the soft cancellation process to the equalization section 325.

However, in the first round, the soft canceller section 324 does not have feedback information and does not receive information regarding IUI from the IUI extraction section 311 according to signal allocation by another transmitting device to an overlapping band. Thus, the soft canceller section 324 does not perform a process of canceling ISI and IUI.

The equalization section 325 performs an equalization process of compensating for distortion of a radio propagation channel such as multiplying an MMSE weight according to propagation channel characteristics estimated by the propagation channel estimation section 312 for the signal B input from the soft canceller section 324. The equalization section 325 outputs the signal B subjected to the equalization process to the IFFT section 326.

The IFFT section 326 transforms the signal B subjected to the equalization process input from the equalization section 325 from frequency-domain signals into time-domain signals, and outputs a processed signal B1 as the transform result to the demodulation section 327.

The demodulation section 327 performs a process of demodulating a modulation symbol for the processed signal B1 input from the IFFT section 326 in correspondence with a modulation method previously transmitted to the transmitting device, and outputs a demodulated signal B2 to the decoding section 328.

The decoding section 328 performs a decoding process for the demodulated signal B2 input from the demodulation section 327 according to the encoding rate reported as control information to the transmitting device and information regarding the constraint length and the puncturing pattern obtained by the propagation channel estimation section 312 from the control information, and outputs the decoding result as signal bits B3 to the replica generation section 329.

The replica generation section 329 re-converts decoded bits into a modulation symbol in correspondence with a modulation method previously transmitted to the transmitting device, and outputs the modulation symbol as a replica signal RB to the FFT section 330.

The FFT section 330 transforms the replica signal RB input from the replica generation section 329 from time-domain signals into frequency-domain signals, and outputs the transform result as feedback information to the soft canceller section 324 and the IUI extraction section 331.

The soft canceller section 324 performs a process of canceling ISI from its own signal B according to the feedback information input from the FFT section 330.

The IUI extraction section 331 generates an IUI replica RB2 from the feedback information input from the FFT section 330, and outputs the IUI replica RB2 to the soft canceller section 304. In the soft canceller section 304, the interference replica RB2 is used for removal of IUI by the signal B from the signal A transmitted from another communication device (that is, the terminal device UE2).

A decoding process for a transmission signal from the terminal device UE2 in a system from the above-described soft canceller section 304 to the IUI extraction section 311 and a decoding process for a transmission signal from the terminal device UE3, which is a transmitting device different from the terminal device UE2, in the system from the soft canceller section 304 to the IUI extraction section 311 are iteratively performed.

The decoding process for the transmission signal of each transmitting device is iteratively performed an arbitrary number of times or a predetermined number of times. Ultimately, a hard decision or the like for decoded bits is made by a decision section (not illustrated) provided in a subsequent stage of each of the decoding sections 308 and 328, so that decoded data for each transmitting device is obtained.

Next, a process in which the receiving device determines a constraint length according to control information input from the transmitting device in the encoding method determination sections 107 and 708 of this embodiment will be described in detail.

In this embodiment, according to a change in convergence characteristics of an iterative process in turbo equalization by an increase in an overlapping rate of the band and/or multi-value of a modulation scheme, the encoding method determination sections 107 and 708 determine constraint lengths of the encoding sections 201 and 204, which are component encoders (RSC encoders) inside the turbo encoding sections 101 and 701, respectively.

At this time, if both the constraint lengths of the encoding sections 201 and 204 are made short, the convergence characteristics of the iterative process in the turbo equalization become good in the system that performs each decoding process described above, but error-correcting capability for a received signal is deteriorated.

In contrast, if the constraint lengths of the two encoding sections are made long, the error-correcting capability for the received signal is improved and increased, but the convergence characteristics of the iterative process in the turbo equalization become bad.

Thus, it is preferable to determine the constraint lengths of the encoding sections 201 and 204, which are the component encoders, in consideration of the convergence characteristics of the iterative process in the turbo equalization by an overlapping rate of the band, number of modulation order, and an encoding rate. Here, the number of modulation order is input from a receiver as the number of bits to be transmitted in one symbol in a multi-value modulation scheme and a modulation scheme. In addition, it is desirable that the two component encoders (the encoding sections 201 and 204) within the turbo encoding sections 101 and 701 determine an encoding method in which the convergence characteristics of the iterative process are good in the turbo equalization while suppressing the deterioration of the error-correcting capability by employing different constraint lengths or changing only one constraint length.

Figure 7:
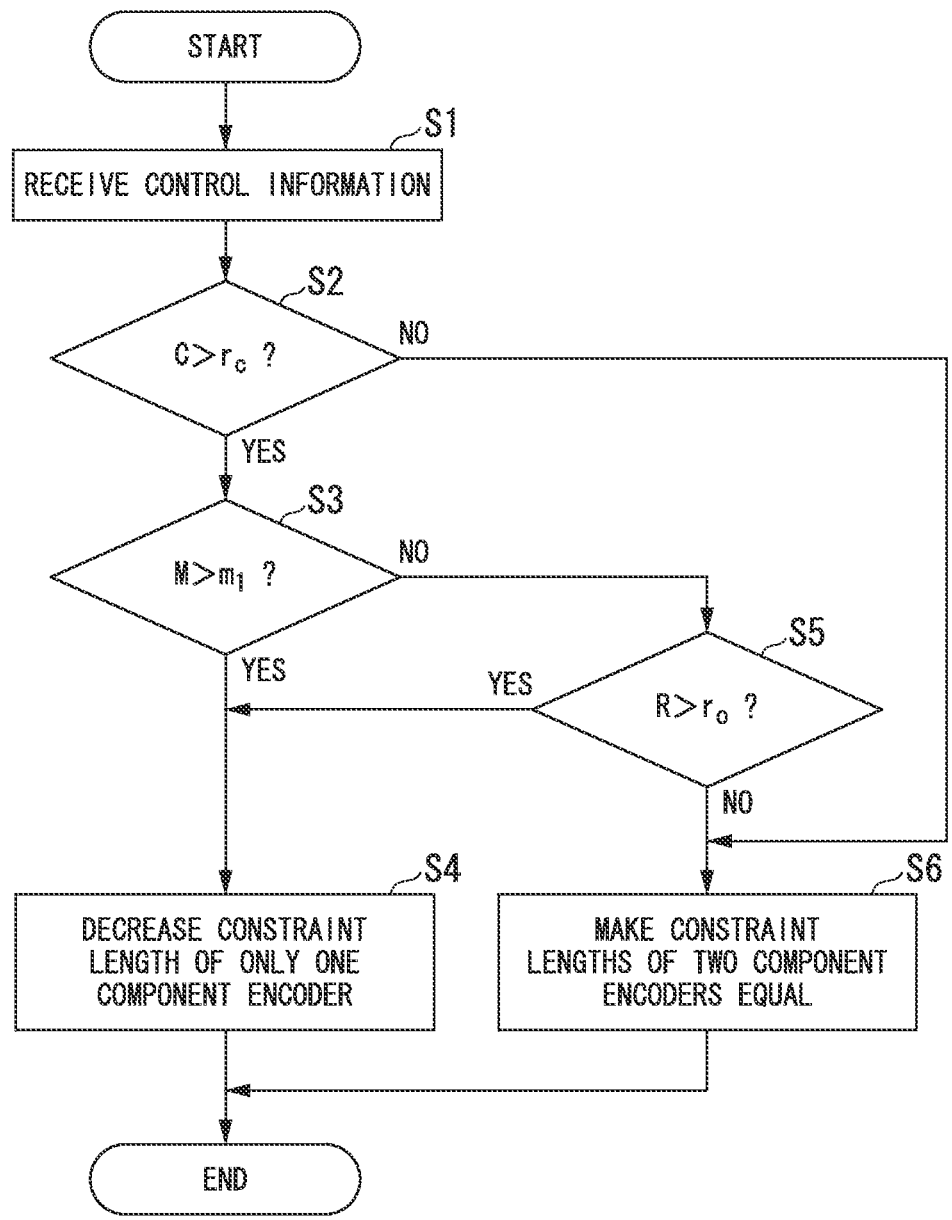
FIG. 7 is a flowchart illustrating an operation example of a constraint-length setting process by an encoding method determination section 107 (708).

Here, an example of a method of determining an encoding rate of the encoding method determination section 107 in this embodiment will be described using FIG. 7. FIG. 7 is a flowchart illustrating an operation example of the method of determining the encoding rate of the encoding method determination section 107.

Step S1:

The control information reception section 108 receives control information reported from the base station device eNB, which is a receiving device, and outputs the received control information to the encoding method determination section 107. The control information reported from the receiving device includes an encoding rate, number of modulation order, and an overlapping rate of band allocation with other transmitting devices. Here, the encoding rate is denoted by C, the number of modulation order is denoted by M, and the overlapping rate of the band allocation with the other transmitting devices is denoted by R.

Step S2:

The encoding method determination section 107 determines whether or not the encoding rate C included in the received control information is a value that is higher than a threshold value $r_c$ of a high encoding rate at which convergence characteristics become bad.

Here, when a relationship between the encoding rate C and the threshold value $r_c$ of the encoding rate is $C > r_c$ the encoding method determination section 107 proceeds to the process of step S3. On the other hand, when the relationship between the encoding rate C and the threshold value $r_c$ of the encoding rate is $C \leq r_c$, the encoding method determination section 107 proceeds to the process of step S6.

Step S3:

When determining that the encoding rate is high in step S2, the encoding method determination section 107 determines whether or not the reported number M of modulation order is greater than an order $m_1$ for which the convergence characteristics are bad. Number of modulation order of QPSK is 2, and number of modulation order of 16 QAM is 4.

Here, when a relationship between the number M of modulation order and the order $m_1$ is $M > m_1$, the encoding method determination section 107 proceeds to the process of step S4. On the other hand, when the relationship between the number M of modulation order and the order $m_1$ is $M \leq m_1$, the encoding method determination section 107 proceeds to the process of step S5.

Step S4:

The encoding method determination section 107 makes the constraint length of one of the encoding sections 201 and 204 short. Thereby, the convergence characteristics of a turbo decoding process are improved.

The encoding method determination section 107, for example, decreases the constraint length in the encoding section 204 by 1 from a constraint length of 4 to a constraint length of 3, and outputs the obtained constraint length to the encoding section 204.

The encoding section 204 changes a configuration of an internal logical operation circuit so that the constraint length of the component encoder is changed in correspondence with the constraint length input from the encoding method determination section 107. In the change in the constraint length, for example, the encoding section 204 changes a configuration of the connections of the delay circuits and the adders as illustrated in FIGS. 5A and 5B. Alternatively, RSC encoders illustrated in FIGS. 5A and 5B are provided within encoding sections, that is, the encoding section has a plurality of RSC encoders having different constraint lengths. The encoding section changes an RSC encoder to be used for generating an error-correcting code according to a constraint length from the encoding method determination section 107. Here, a constraint length of one encoding section to be changed or a degree of a change in the constraint length is preset inside the encoding method determination section 107.

For example, there may be provided a table for setting (one, two, or more) lengths for a constraint length to be changed by combining a difference between the number M of modulation order and the order $m_1$, a difference between the encoding rate C and the threshold value $r_c$, and a difference between an overlapping rate R and a threshold value $r_0$, and the like. In step S4, a constraint length corresponding to a combination is read from the table, and a configuration may be made to perform adjustment according to the read constraint length.

In addition, by setting a number for changing a constraint length according to a combination of comparative targets such as decreasing the constraint length by 1 in the case of "YES" in step S5 after "NO" in step S2 and decreasing the constraint length by 2 in the case of "YES" in step S3 after "YES" in step S2, a configuration may be made to select the constraint length according to the combination.

Step S5:

The encoding method determination section 107 determines whether or not the overlapping rate R of the band reported from the receiving device is higher than the threshold value $r_0$ at which the convergence characteristics become bad.

Here, when a relationship between the overlapping rate R and the threshold $r_0$ is $R > r_0$, the encoding method determination section 107 proceeds to the process of step S4. On the other hand, when the relationship between the overlapping rate R and the threshold $r_o$ is $R \leq r_0$, the encoding method determination section 107 proceeds to the process of step S6.

Step S6:

If the encoding method determination section 107 determines that the encoding rate C is less than or equal to $r_c$, the improvement of the convergence characteristics by a change in the constraint length is unnecessary. Thus, the encoding method determination section 107 makes a setting to use the same constraint length (for example, a constraint length of 4) without changing the constraint lengths of the encoding sections 201 and 204, which are the two component encoders.

As described above, according to this embodiment, the constraint lengths of the component encoders are sequentially changed according to the overlapping rate of the band, the number of modulation order, and the encoding rate. Thus, for example, a difference is given by changing one constraint length when there are the same constraint lengths. Consequently, it is possible to use an encoding rate exceeding a threshold value at which the convergence characteristics become bad and an overlapping rate exceeding a threshold value at which the convergence characteristics become bad in conventional techniques. Thus, it is possible to improve error-rate characteristics in various modulation schemes/communication schemes.

In addition, it is also necessary for a receiver to determine a constraint length using the threshold values $r_c$, $m_1$, and $r_0$ as condition values that deteriorate the convergence characteristics of the iterative process in the turbo equalization. Thus, the three parameters are preset to be identical between the receiving device and the transmitting device and stored. In this embodiment, an example in which the constraint length is changed has been described. However, a plurality of component encoders include turbo encoding sections having the same constraint length and turbo encoding sections having different constraint lengths, and the turbo encoding section for use in error correction may be determined according to conditions of FIG. 7.

Figure 8:
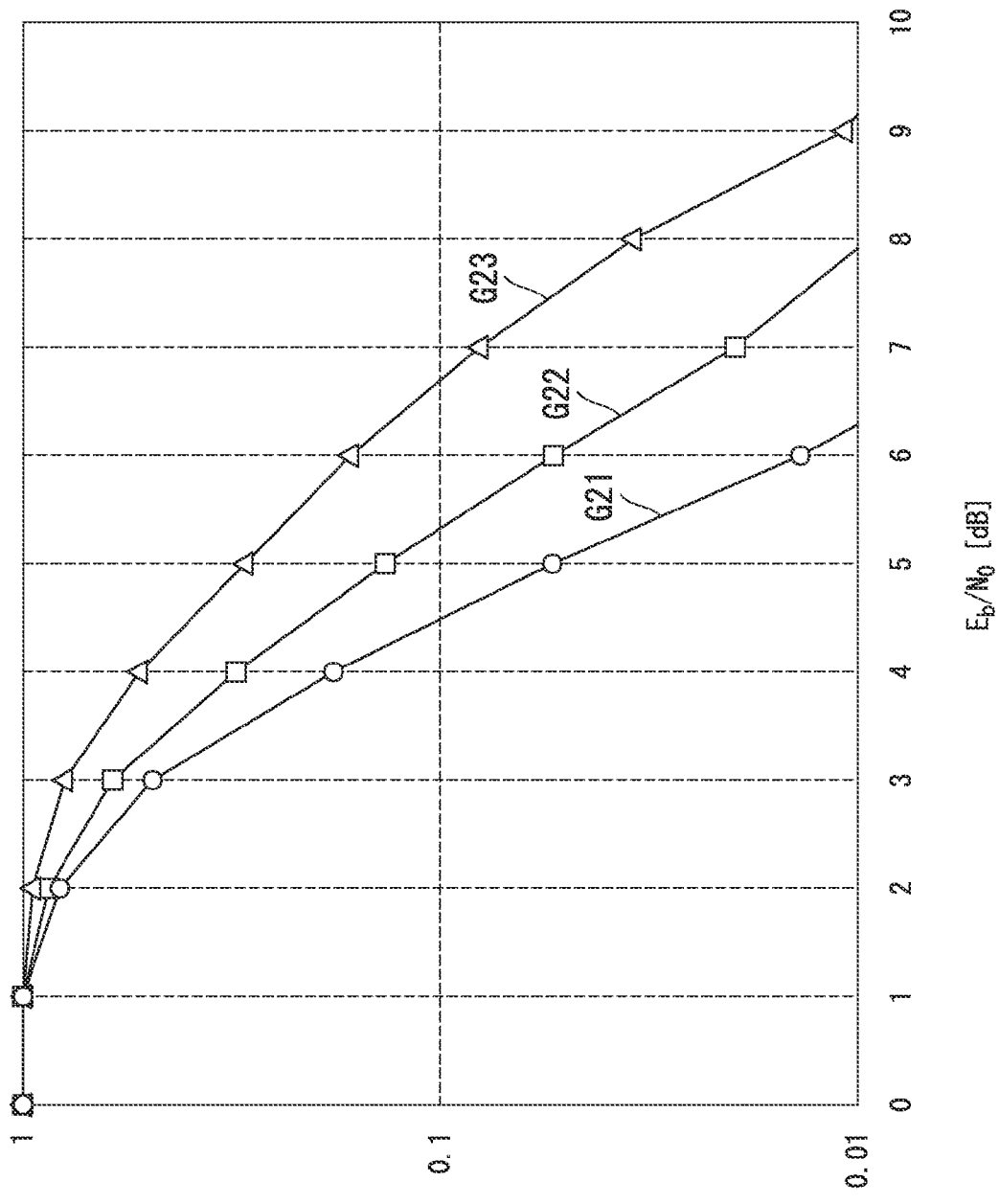
FIG. 8 is a graph illustrating correspondence between a frame error rate and an average transmission signal energy to noise power spectral density ratio per information bit by a configuration of a wireless communication system of this embodiment.

FIG. 8 is a graph illustrating a relationship of simulation results of a frame error rate (FER) and $E_b/N_o$ (average transmission signal energy to noise power spectral density ratio per information bit) when the number of terminal devices, which are transmitting devices, is 2 (terminal devices UE2 and UE3) and the receiving device performs allocation by permitting overlapping of part of a frequency band, and encoding of the transmitting device has an encoding rate of ¾. In addition, the number of iterations in the turbo equalization in the receiving device is 8, and the number of iterations of turbo decoding is 8.

In FIG. 8, constraint lengths ($K_1$, $K_2$) indicate the case in which the encoding sections 201 and 204 that are the two component encoders within the turbo encoding section 101 have a constraint length of $K_1$ and a constraint length of $K_2$, respectively. Constraint lengths (3, 3) indicate characteristics in which turbo encoding is performed by component encoders of constraint lengths of 3 connected in parallel. In FIG. 8, characteristics G21 indicate the case of constraint lengths (4, 3) of a turbo code. In addition, characteristics G22 indicate the case of constraint lengths (4, 4) of the turbo code. In addition, characteristics G23 indicate the case of constraint lengths (3, 3) of the turbo code.

When the encoding sections 201 and 204 within the turbo encoding section 101 have the constraint lengths of 3 or 4 from FIG. 8, component encoders having constraint lengths different from the constraint lengths of 3 and 4 are provided in parallel if interference is much and a turbo code formed by concatenating codes generated from the component encoders is applied as in this embodiment. Thereby, it can be seen that characteristics of communication are improved by lowering the FER even when a noise ratio is high. For example, when $E_b/N_0$ is 6 dB, the FER is 0.166 when the constraint lengths of the two component encoders are (3, 3). In addition, when the constraint lengths are (4, 4), the FER is 0.052. On the other hand, when the constraint lengths are (4, 3), the FER is 0.013. That is, the FER is significantly improved.

In addition, the turbo encoding section 701 also has substantially the same configuration as the turbo encoding section 101.

In addition, in this embodiment, the case in which the constraint length of each component encoder within the turbo encoding section 101 is changed in consideration of interference by IUI and ISI has been described. However, the present invention is applicable when interference is suppressed according to the iterative process such as the turbo equalization even when there is interference not disclosed in this embodiment.

In addition, the uplink in which the transmitting devices are UE2 and UE3 and the receiving device is the base station eNB has been described. However, the present invention is also applicable even in the downlink in which the transmitting device is a plurality of base station devices eNB and the receiving device is UE. In such a case, the transmitting device can also determine band allocation and/or a modulation scheme, an overlapping rate, and the like, and implementation is possible by reporting a constraint length of a component encoder using an error-correcting code in addition to control information used for data transmission from the transmitting device to the receiving device.

In addition, the number of transmitting devices has been described to be two of the terminal devices UE2 and UE3. However, even when the number of transmitting devices is three or more, the present invention is applicable when the receiving device has sets of the soft canceller 304 to decoding section 308 in FIG. 6 in the same number as the number of transmitting devices. For example, when the number of terminal devices is 3, only a soft replica fed back from the decoding section 308 becomes information regarding ISI to be canceled in the soft canceller section 304. In addition, a soft replica fed back from each of the two other decoders becomes IUI information. ISI and IUI information is used for processes of canceling ISI and IUI.

An example in which the turbo equalization is applied to a reception process using a transmission scheme based on a single carrier has been described. However, the present invention is applicable even when the receiving device performs iterative processes of the interference canceller and the decoding section even in multi-carrier.

For example, in the transmitting device illustrated in FIG. 3, it is unnecessary to perform a transform process by the FFT section 103 for a modulation symbol modulated by the modulation section 102 from the time domain to the frequency domain. That is, the modulation section 102 may output the modulated modulation symbol to the mapping section 104.

The mapping section 104 may map the modulation symbol to each frequency according to band allocation information and output an allocated data signal to the IFFT section 105.

Because a subsequent process is the same as a process for a transmission signal described above, description thereof is omitted.

Figure 9:
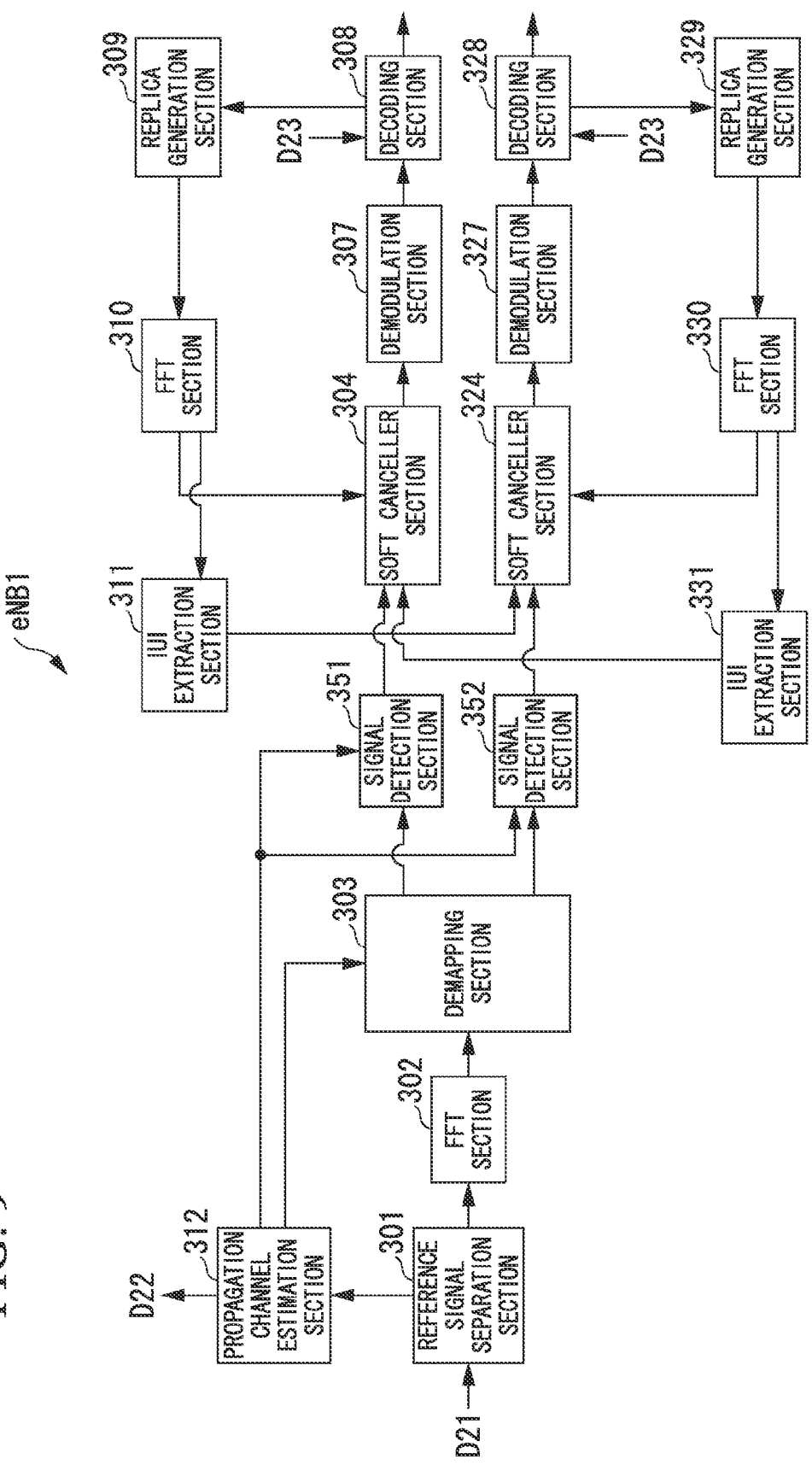
FIG. 9 is a block diagram illustrating a configuration example in which a receiving device of the base station device eNB1 of this embodiment supports communication using multi-carrier.

Next, a receiving device of a base station eNB1 when the transmission scheme is based on multi-carrier has a configuration illustrated in FIG. 9. The receiving device of FIG. 9 is different from the receiving device of FIG. 6 in that the equalization sections 305 and 325 and the IFFT sections 306 and 326 are absent and signal detection sections 351 and 352 are newly added.

Based on estimated values of propagation characteristics input from the propagation channel estimation section 312, the signal detection sections 351 and 352 detect phases of demapped signals input from the demapping section 303, and each output the detected phases to the soft canceller sections 304 and 325. Because the other processes are the same as the operations described above, description thereof is omitted.

In addition, in the encoding method determination section 107 of this embodiment, a constraint length of each component encoder is determined according to comparison processes illustrated in FIG. 7 with condition values, which deteriorate an iterative process in turbo equalization, corresponding to items based on communication parameters including the items such as an encoding rate, a modulation scheme (number of modulation order), and an overlapping rate of band allocation with other communication devices.

Unlike the above-described configuration, the propagation channel estimation section 312 of the receiving device side may determine a constraint length of each component encoder of each transmitting device according to an encoding rate, a modulation scheme, an overlapping rate of the band, and the like set from an estimated propagation channel with each transmitting device, and report the determined constraint length as the control information to the transmitting device. In addition, the number of reception antennas of the receiving device may be included as control information, and a configuration may be made to determine a constraint length as in the second embodiment to be described later.

In addition, the receiving device does not report an overlapping rate of the band to the transmitting device, and the encoding method determination section 107 may be configured so that the encoding method determination section 107 of the transmitting device compares one or two items of the encoding rate and the modulation scheme to condition values, which deteriorate the convergence characteristics of the iterative process in the turbo equalization, corresponding to the items, and the constraint length is determined from the comparison result.

In addition, as another method of determining the constraint length of the component encoder, the encoding method determination section 107 may be configured so that the receiving device transmits only an overlapping rate of the band to the transmitting device and the transmitting device compares the overlapping rate of the band to a condition value, which deteriorates the convergence characteristics of the iterative process in the turbo equalization, and determines the constraint length of the component encoder from the comparison result.

Further, the configuration of this embodiment has been described for an example in which only one component encoder makes the constraint length short to improve the convergence characteristics in the determination of the constraint length. However, in the case of a short constraint length of, for example, 3, when two component encoders within the turbo encoding section 101 (or 701) use the same constraint length, a configuration may be made so that only one component encoder makes the constraint length long in contrast to this embodiment and the two component encoders use different constraint lengths.

As described above, the receiving device using an iterative process such as turbo equalization can improve convergence characteristics by configuring the component encoders within the turbo encoding section in different constraint lengths when the encoding rate is high and/or when the overlapping rate of band allocation is high or even in an environment in which the convergence characteristics of the iterative process in the turbo equalization become bad such as when the number of modulation order is greater than or equal to a constant value by applying this embodiment. Thereby, it is possible to improve frequency utilization efficiency.

In addition, it is possible to improve error-rate characteristics even in an environment in which interference is much even for various modulation schemes and/or communication schemes and propagation channel characteristics because an encoding constraint length or a puncturing pattern from an encoding rate is determined and a turbo code is generated by applying this embodiment.

Second Embodiment

In the second embodiment, a transmitting device is designated as a terminal device UE1 that performs MIMO transmission by multiple antennas (see FIG. 1) and the receiving device is designated as a base station device eNB2. A configuration example in which convergence characteristics are improved by configuring component encoders within a turbo encoding section in different convergence lengths in an environment in which the convergence characteristics of an iterative process in turbo equalization are bad such as when the encoding rate and/or multi-value modulation are high and a correlation value between antennas is high when the receiving device uses the iterative process such as the turbo equalization will be described using FIG. 10.

Figure 10:
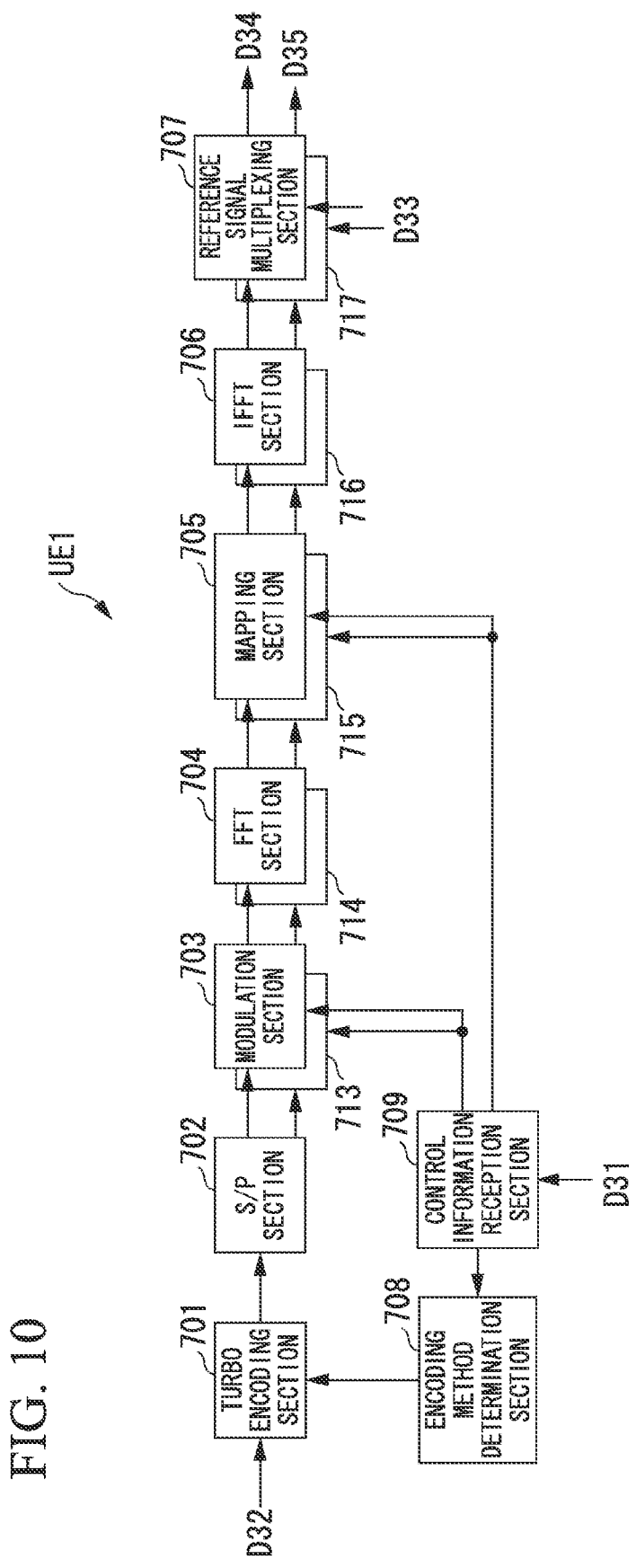
FIG. 10 is a block diagram illustrating a configuration example of a terminal device UE1 according to a second embodiment of the present invention.

FIG. 10 is a block diagram illustrating a configuration example of a terminal device UE1, which is a transmitting device, according to the second embodiment. The terminal device UE1 includes a turbo encoding section 701, a serial/parallel (S/P) section 702, a modulation section 703, an FFT section 704, a mapping section 705, an IFFT section 706, a reference signal multiplexing section 707, an encoding method determination section 708, a control information reception section 709, a modulation section 713, an FFT section 714, a mapping section 715, an IFFT section 716, and a reference signal multiplexing section 717.

In the terminal device UE1, which is the transmitting device, the control information reception section 709 receives control information D31 transmitted from the base station device eNB2. The control information received by the control information reception section 709 includes encoding rate, modulation scheme, and band allocation information, information regarding a correlation value between antennas, and the like. The control information reception section 709 outputs information such as the encoding rate and/or the modulation scheme included in the control information and an overlapping rate of the band to the encoding method determination section 708. In addition, the control information reception section 709 outputs the modulation scheme included in the control information to the modulation sections 703 and 713.

In addition, the control information reception section 709 outputs the band allocation information to the mapping sections 705 and 715.

Like the encoding method determination section(s) 107 (and 708) illustrated in FIG. 3, the encoding method determination section 708 determines a puncturing pattern and a constraint length of each component encoder within the turbo encoding section 701 based on information regarding the encoding rate and/or the modulation scheme and the correlation value between the antennas reported as the control information. The encoding method determination section 708 outputs the determined puncturing pattern and constraint length to the turbo encoding section 701. Because the turbo encoding section 701 in this embodiment has substantially the same configuration as the turbo encoding section 101 of FIG. 4, description thereof is omitted.

Figure 4:
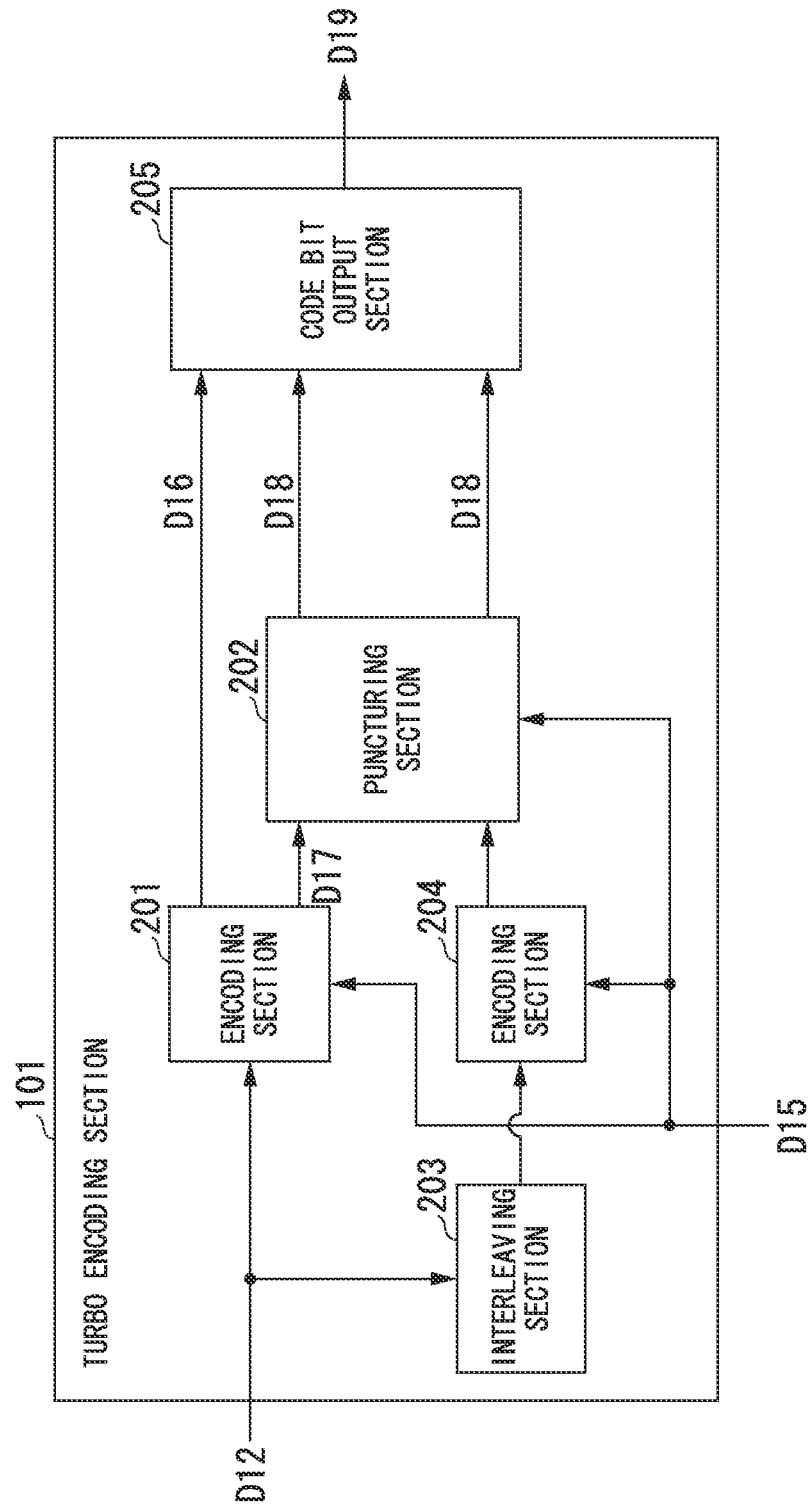
FIG. 4 is a block diagram illustrating a configuration example of turbo encoding sections 101 and 701.

The turbo encoding section 701 performs encoding by an encoding method determined by the encoding method determination section 708, that is, encodes data bits D32 according to the puncturing pattern and the constraint length as in the turbo encoding section 101 illustrated in FIG. 4. The turbo encoding section 701 outputs the encoded bits to the S/P section 702.

The S/P section 702 converts each of the encoded bits input from the turbo encoding section 710 into two parallel bits in an input order according to S/P conversion, outputs one bit of the two parallel bits to the modulation section 703 as a transmission bit, and outputs the other bit of the two parallel bits to the modulation section 713 as a transmission bit. The two parallel bits become the transmission bits to be transmitted from transmission antennas, that is, a transmission antenna T1 (see FIG. 1) and a transmission antenna T2 (see FIG. 1).

Each of the modulation sections 703 and 713 generates a modulation symbol according to a modulation scheme corresponding to information regarding a modulation scheme input from the control information reception section 709. In addition, the modulation section 703 outputs the generated modulation symbol to the FFT section 704. In addition, the modulation section 713 outputs the generated modulation symbol to the FFT section 714.

The FFT section 704 transforms the modulation symbol input from the modulation section 703 from the time domain into a frequency-domain data signal, and outputs the data signals after the transform to the mapping section 705.

Likewise, the FFT section 714 transforms the modulation symbol input from the modulation section 713 from the time domain into a frequency-domain data signal, and outputs the data signals after the transform to the mapping section 715.

The mapping section 705 performs a process of allocating the frequency-domain data signals to allocated bands based on band allocation information input from the control information reception section 709, and outputs the allocated data signal to the IFFT section 706.

The mapping section 715 performs a process of allocating the frequency-domain data signals to allocated bands based on band allocation information input from the control information reception section 709, and outputs the allocated data signal to the IFFT section 716.

The IFFT section 706 transforms the frequency-domain signal into a time-domain transmission signal, and outputs the transmission signals after the transform to the reference signal multiplexing section 707.

The IFFT section 716 transforms the frequency-domain signal into a time-domain transmission signal, and outputs the transmission signals after the transform to the reference signal multiplexing section 717.

The reference signal multiplexing section 707 performs a process of multiplexing a reference signal D33 (a pilot signal in which a code pattern is known) with a transmission signal in the time domain, and outputs a transmission signal D34 to the transmission antenna T1.

The reference signal multiplexing section 717 performs a process of multiplexing the reference signal D33 with a transmission signal in the time domain, and outputs a transmission signal D35 to the transmission antenna T2.

Although not illustrated in FIG. 10, a CP is inserted into the transmission signal D35 from the reference signal multiplexing section 717. The transmission signal D35 with the CP is converted into an analog signal by D/A conversion and the analog signal is up-converted into an RF. The up-converted signal is amplified by the PA to transmission power, and the amplified signal is transmitted from the transmission antenna T2.

Here, in the transmitting device illustrated in FIG. 10, a plurality of transmission antennas (the transmission antennas T1 and T2) use the same frequency at the same time so as to perform MIMO transmission. Thus, non-contiguous band allocation as illustrated in FIG. 11 or continuous band allocation of an example of FIG. 12 is performed.

Figure 11:
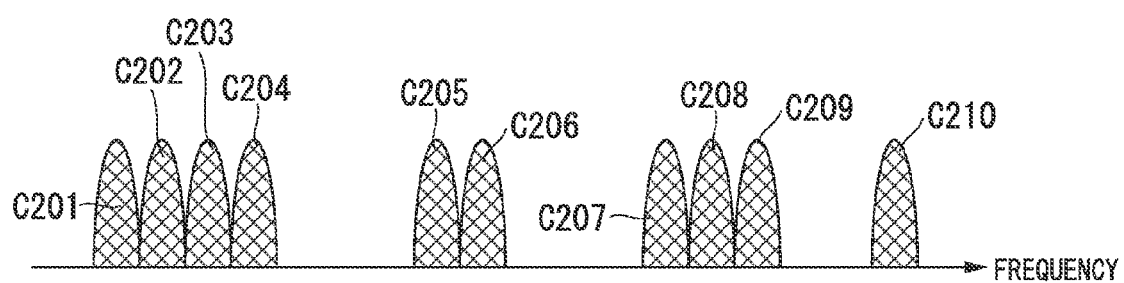
FIG. 11 is a diagram illustrating allocation of a non-contiguous frequency band for transmission antennas T1 and T2.

FIG. 11 illustrates an example of non-contiguous band allocation to the transmission antennas T1 and T2. That is, FIG. 11 illustrates the case in which 10 subcarriers C201 to C210 present in a non-contiguous band are allocated to the transmission antennas T1 and T2.

Figure 12:
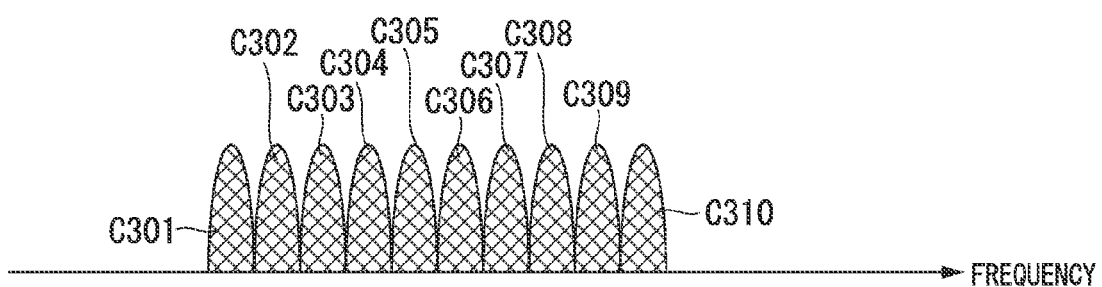
FIG. 12 is a diagram illustrating allocation of a continuous frequency band for transmission antennas T1 and T2.

FIG. 12 illustrates an example of continuous band allocation to the transmission antennas T1 and T2. That is, FIG. 12 illustrates the case in which 10 subcarriers C301 to C310 present in a continuous band are allocated to the transmission antennas T1 and T2.

Figure 13:
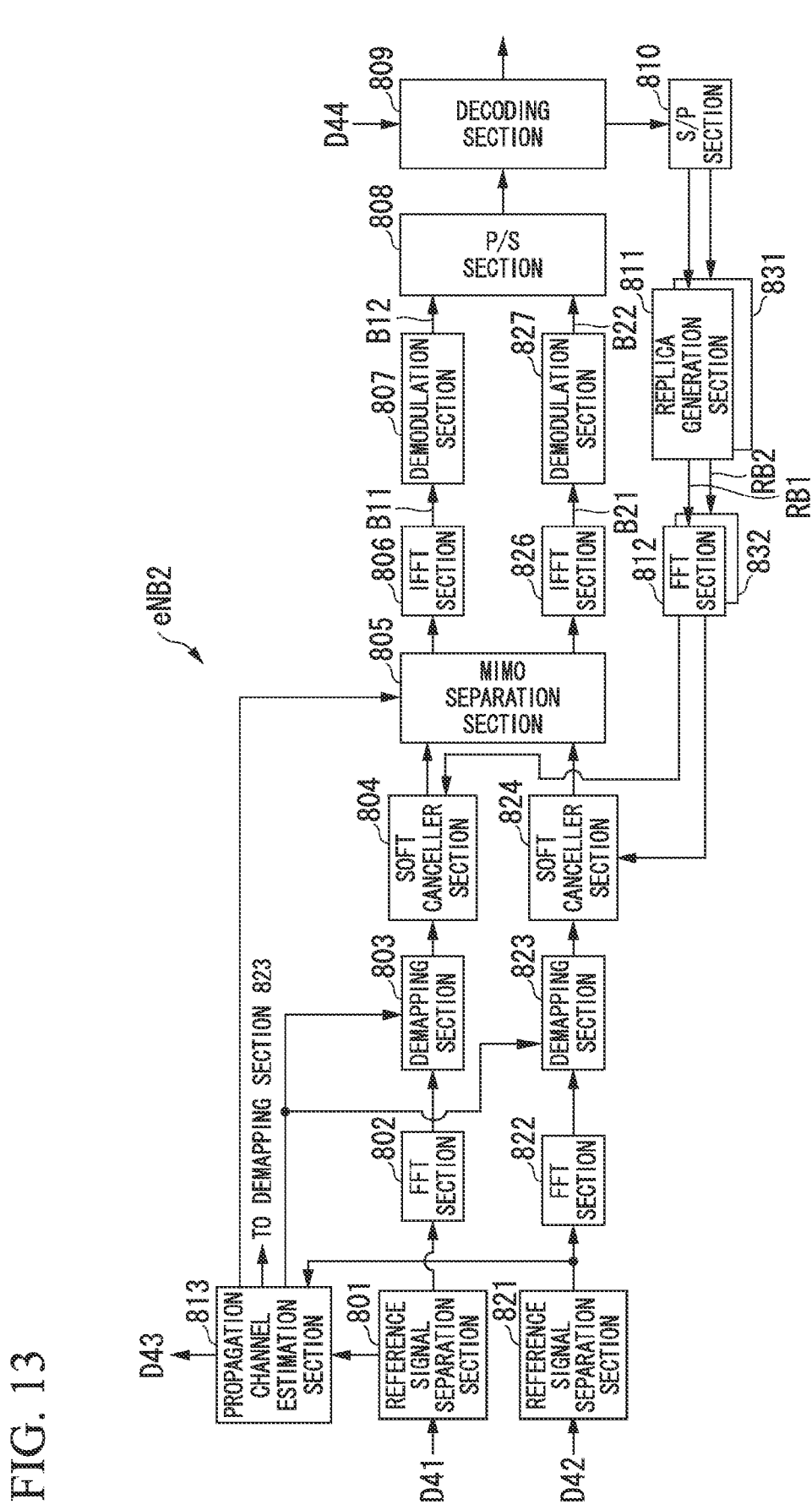
FIG. 13 is a block diagram illustrating a configuration example of a receiving device of a base station device eNB2 according to the second embodiment of the present invention.

Next, the base station device eNB2 according to this embodiment will be described with reference to FIG. 13. FIG. 13 is a block diagram illustrating an example of a receiving device of the base station device eNB2 according to this embodiment.

The receiving device (base station device eNB2) having two reception antennas as illustrated in FIG. 1 will be described in this embodiment. However, the receiving device (base station device eNB2) may have three or more reception antennas.

In FIG. 13, the base station device eNB2 has a reference signal separation section 801, an FFT section 802, a demapping section 803, a soft canceller section 804, a MIMO separation section 805, an IFFT section 806, a demodulation section 807, a P/S section 808, a decoding section 809, an S/P section 810, a replica generation section 811, an FFT section 812, a propagation channel estimation section 813, a reference signal separation section 821, an FFT section 822, a demapping section 823, a soft canceller section 824, an IFFT section 826, a demodulation section 827, a replica generation section 831, and an FFT section 832.

The reference signal separation section 801 receives a reception signal D41 from the transmitting device (terminal device UE1) via a reception antenna TB1, and performs separation into encoded data and a reference signal.

In addition, the reference signal separation section 821 receives a reception signal D42 from the transmitting device (terminal device UE1) via a reception antenna TB2, and performs separation into encoded data and a reference signal.

Here, the reception antennas TB1 and TB2 simultaneously receive a reception signal from the terminal device UE1.

In addition, the reference signal separation section 801 down-converts the received reception signal D41 into a baseband signal, converts the baseband signal into a digital signal by A/D conversion, and outputs the digital signal to the FFT section 802.

Likewise, the reference signal separation section 821 down-converts the received reception signal D42 into a baseband signal, converts the baseband signal into a digital signal by A/D conversion, and outputs the digital signal to the FFT section 822.

In addition, the reference signal separation sections 801 and 821 remove CPs from the reception signals D41 and D42, separate the reference signals from the digital signals, and output the separated reference signals to the propagation channel estimation section 813.

The propagation channel estimation section 813 estimates propagation channel characteristics of each of a plurality of receiving devices from an input reference signal of each transmitting device, and outputs the estimated propagation channel characteristics to the MIMO separation section 805 and the demapping sections 803 and 823.

In addition, the propagation channel estimation section 813 sets band allocation (band allocation information), an encoding rate, a modulation scheme, and the like for each transmitting device according to the estimated propagation channel characteristics, and calculates a correlation value between antennas.

The propagation channel estimation section 813 converts control information D43 including the set band allocation information, encoding rate, and modulation scheme, and the correlation value between the antennas into a signal for feedback. The propagation channel estimation section 813 transmits the converted control information D43 to the transmitting device (terminal device UE1) via a modulation section, a wireless section, and a transmission antenna (not illustrated).

Like the FFT section 302 of FIG. 6, the FFT sections 802 and 822 transform time-domain signals into frequency-domain signals, and output signals of the transform results to the demapping sections 803 and 823.

Like the demapping section 303 of FIG. 6, the demapping sections 803 and 823 perform separation into signals from transmitting devices according to internally stored mapping information input from the propagation channel estimation section 813 and previously transmitted to the transmitting devices. The demapping sections 803 and 823 output the separated signals to the soft canceller sections 804 and 824.

The soft canceller sections 804 and 824 perform substantially the same processes as the soft canceller sections 304 and 324 of FIG. 6, and output signals from which ISI and IUI are canceled to the MIMO separation section 805.

The MIMO separation section 805 separates a spatially multiplexed signal based on propagation channel information estimated from reference signals received by the reception antennas TB1 and TB2 input from the propagation channel estimation section 813.

The MIMO separation section 805, for example, outputs a separated signal of the reception antenna TB1 to the IFFT section 806, and outputs a separated signal of the reception antenna TB2 to the IFFT section 826.

The IFFT section 806 transforms the signal of the reception antenna TB1 input from the MIMO separation section 805 from frequency-domain signals into time-domain signals, and outputs a processed signal B1 as the transform result to the demodulation section 807.

Likewise, the IFFT section 826 transforms the signal of the reception antenna TB2 input from the MIMO separation section 805 from frequency-domain signals into time-domain signals, and outputs a processed signal B2 as the transform result to the demodulation section 827.

The demodulation section 807 performs a process of demodulating a modulation symbol for a processed signal B11 input from the IFFT section 806 in correspondence with a modulation method previously transmitted to the transmitting device, and outputs a demodulated signal B12 to the P/S section 808.

The demodulation section 827 performs a process of demodulating a modulation symbol for a processed signal B21 input from the IFFT section 826 in correspondence with a modulation method previously transmitted to the transmitting device, and outputs a demodulated signal B22 to the P/S section 808.

The P/S section 808 converts the demodulated signal B12 input from the demodulation section 807 and the demodulated signal B22 input from the demodulation section 827 according to P/S conversion in the order in which S/P conversion has been performed by the S/P section 702 of FIG. 10, and outputs the P/S conversion result to the decoding section 809.

The decoding section 809 performs a decoding process for a signal input from the P/S section 808 after the P/S conversion according to information (encoding information D44) regarding a constraint length and/or an encoding rate reported to the transmitting device as control information, and outputs the decoding result to the S/P section 810.

The S/P section 810 performs substantially the same S/P conversion as the S/P section 702 of FIG. 10, outputs a signal bit stream corresponding to the processed signal B11 to the replica generation section 811, and outputs a signal bit stream corresponding to the processed signal B21 to the replica generation section 831.

Like the replica generation section 309 of FIG. 6, the replica generation section 811 generates a replica signal RB1 from the signal bit stream corresponding to the processed signal B11, and outputs the generated replica signal RBI to the FFT section 812.

Likewise, like the replica generation section 309 of FIG. 6, the replica generation section 831 generates a replica signal RB2 from the signal bit stream corresponding to the processed signal B21, and outputs the generated replica signal RB2 to the FFT section 832.

Like the FFT section 330 of FIG. 6, the FFT section 812 transforms the replica signal RB1 input from the replica generation section 811 from time-domain signals into frequency-domain signals. The FFT section 812 outputs the transform result as feedback information to the soft canceller section 824.

The soft canceller section 804 performs a process of canceling ISI from its own processed signal B11 according to the feedback information input from the FFT section 812.

The FFT section 832 transforms the replica signal RB2 input from the replica generation section 831 from time-domain signals into frequency-domain signals. The FFT section 832 outputs the transform result as feedback information to the soft canceller section 824.

The soft canceller section 824 performs a process of canceling ISI from its own processed signal B21 according to the feedback information input from the FFT section 832.

Because a subsequent decoding process is substantially the same as a process of each corresponding part in FIG. 6, description thereof is omitted.

Next, a process in which the encoding method determination section 708 (FIG. 10) of this embodiment determines a constraint length according to control information input from a transmitting device will be described in detail. In this embodiment, a turbo equalization process of feeding back an output of the decoding section 809 to the soft canceller sections 804 and 824 is performed for the purpose of the receiving device removing ISI.

Thus, when an encoding rate is high and/or when a correlation value between antennas is high and the remaining inter antenna interference (IAI) is much, the encoding method determination section 708 determines constraint lengths of the encoding section 201 (FIG. 4) and the encoding section 204 (FIG. 4), which are the component encoders within the turbo encoding section, according to a change in convergence characteristics of an iterative process in turbo equalization using a turbo decoding section such as when number of modulation order is greater than or equal to a constant value.

Figure 14:
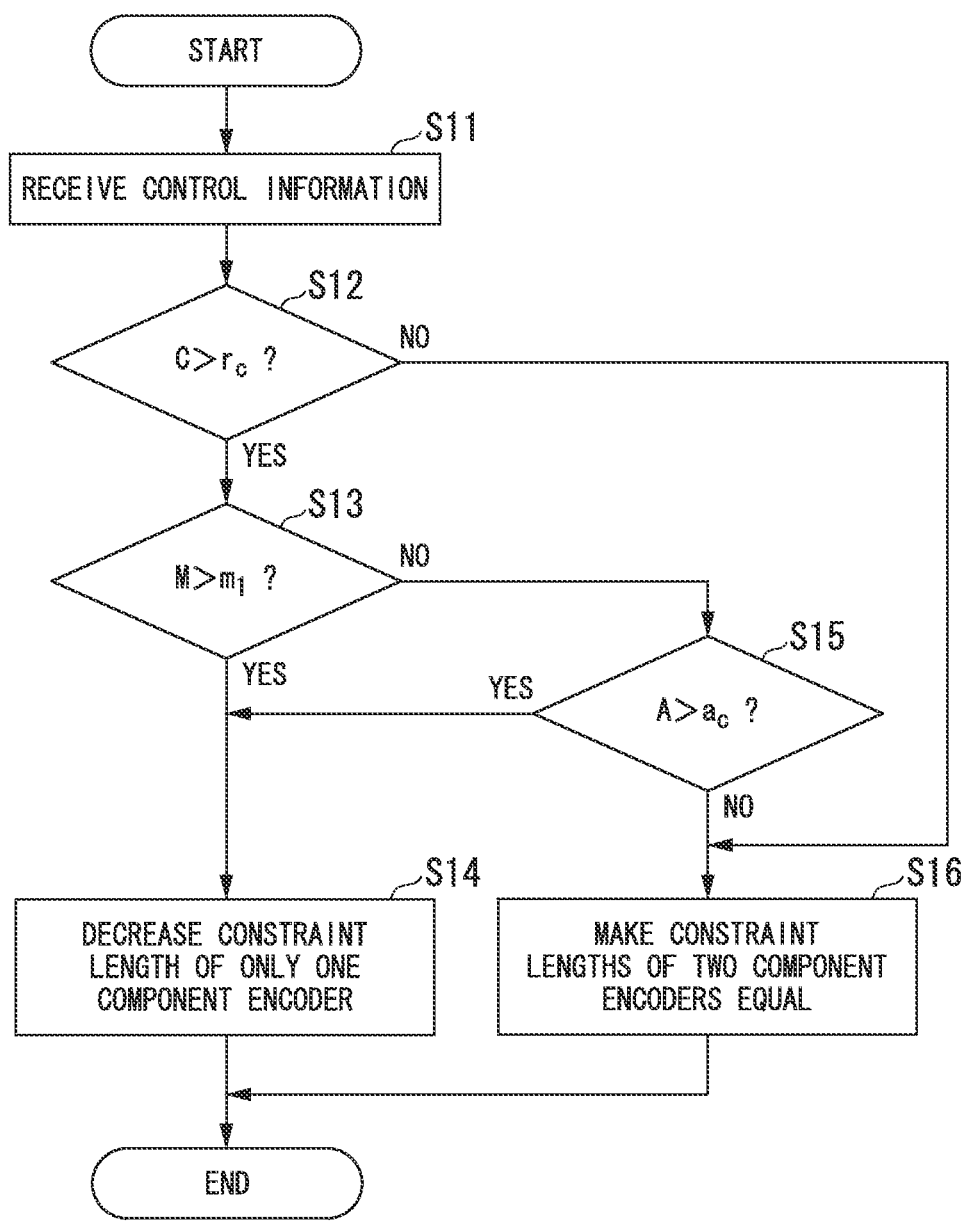
FIG. 14 is a flowchart illustrating an operation example of a constraint-length setting process by an encoding method determination section 708.

Here, the encoding method determination section 708 determines the constraint lengths of the encoding section 201 and the encoding section 204 according to the change in the convergence characteristics of the iterative process in the turbo equalization by the correlation value between the antennas, the number of modulation order, and the encoding rate. An example of this determination method will be described using FIG. 14. FIG. 14 is a flowchart in which the constraint lengths are obtained by the correlation value between the antennas, the number of modulation order, and the encoding rate.

Step S11:

The control information reception section 709 receives control information reported from the base station device eNB2, and outputs the received control information to the encoding method determination section 708. In the control information reported from the receiving device, the encoding rate is denoted by C, the number of modulation order is denoted by M, and the correlation value between the antennas is denoted by A.

Step S12:

The encoding method determination section 708 determines whether or not the encoding rate C included in the received control information is higher than a threshold value $r_c$, which is a high encoding rate at which convergence characteristics become bad (whether or not $C > r_c$).

At this time, when the encoding rate C exceeds the threshold value $r_c$ (C>$r_c$), the encoding method determination section 708 proceeds to the process of step S13. On the other hand, when the encoding rate C is less than or equal to the threshold value $r_c$ (C≤$r_c$), the encoding method determination section 708 determines that it is not necessary to improve the convergence characteristics by changing the constraint length, and proceeds to the process of step S16.

Step S13:

The encoding method determination section 708 determines whether or not the reported number M of modulation order is larger than the order $m_1$ for which the convergence characteristics are bad (whether or not M>$m_1$).

At this time, when the number M of modulation order exceeds the order $m_1$ (M>$m_1$), the encoding method determination section 708 determines that the convergence characteristics are bad, and proceeds to the process of step S14. On the other hand, when the number M of modulation order is less than or equal to the order $m_1$ (M≤$m_1$), the encoding method determination section 708 proceeds to the process of step S15.

Step S14:

The encoding method determination section 708 decreases the constraint length of one of the encoding sections 201 and 204. Thereby, convergence characteristics of a turbo decoding process are improved.

The encoding method determination section 708, for example, decreases the constraint length in the encoding section 204 by 1 from a constraint length of 4 to a constraint length of 3, and outputs the obtained constraint length to the encoding section 204 (FIG. 4) of the turbo encoding section 701. The encoding section 204 changes a configuration of an internal logical operation circuit so that the constraint length of the component encoder is changed in correspondence with the constraint length input from the encoding method determination section 708. In the change in the constraint length, for example, the encoding section 204 changes a configuration of connections of the delay circuits and the adders as illustrated in FIGS. 5A and 5B. Alternatively, RSC encoders illustrated in FIGS. 5A and 5B are provided within encoding sections, that is, the encoding section has a plurality of RSC encoders having different constraint lengths. The encoding section changes an RSC encoder to be used for generating an error-correcting code according to a constraint length from the encoding method determination section 708. Here, a constraint length of one encoding section to be changed or a degree of a change in the constraint length is preset inside the encoding method determination section 708.

Step S15:

The encoding method determination section 708 determines whether or not a correlation value A between antennas reported from the receiving device is higher than a threshold value $a_c$ at which convergence characteristics becomes bad (whether or not A>$a_c$).

At this time, when the correlation value A between the antennas exceeds the threshold value $a_c$ (A>$a_c$), the encoding method determination section 708 determines that the convergence characteristics are bad and proceeds to the process of step S14. On the other hand, when the correlation value A between the antennas is less than or equal to the threshold value $a_c$ (A≤$a_c$), the encoding method determination section 708 determines that it is not necessary to improve the convergence characteristics by changing the constraint length, and proceeds to the process of step S16.

Step S16:

Because it is not necessary to improve the convergence characteristics by changing the constraint length in the encoding method determination section 708, the two component encoders of the encoding sections 201 and 204 use the same constraint length. For example, the encoding method determination section 708 sets the constraint length of each of the encoding sections 201 and 204 to 4, and ends a constraint-length control process.

In addition, because the determination of the constraint length using threshold values $r_c$, $m_1$, and $a_c$ used in the flowchart illustrated in FIG. 14 is also required for the receiver, the same values for the three parameters are predetermined in both the transmitting device and the receiving device.

In this embodiment, the constraint length of each of the turbo encoding sections 201 and 204, which are the component encoders within the turbo encoding section 701, is changed in consideration of interference by IAI and ISI. However, the present invention is applicable when interference is suppressed according to an iterative process such as turbo equalization even when there is interference not disclosed in this embodiment.

In addition, although uplink in which the transmitting device is UE1 and the receiving device is the base station device eNB2 has been described, the present invention is also applicable to downlink when the transmitting device has a plurality of receiving devices.

In addition, although the number of transmission antennas of the transmitting device has been described to be 2, the present invention is similarly applicable even when the number is three or more.

Although an example in which a transmission scheme is based on a single carrier and turbo equalization is applied to a reception process has been described, the present invention is applicable when the receiving device performs an iterative process of an interference canceller and a decoding section even for multi-carrier as in the first embodiment.

In addition, in the encoding method determination section 708 of this embodiment, a constraint length of each component encoder is determined according to a process illustrated in FIG. 14 of making a comparison to condition values, which deteriorate the iterative process in the turbo equalization, corresponding to items based on communication parameters including the items such as a correlation value between antennas, an encoding rate, and a modulation scheme (number of modulation order). The receiving device side may determine the constraint length for each component encoder of each transmitting device and report the determination result as control information.

In addition, the receiving device does not report a correlation value between antennas to the transmitting device, and the encoding method determination section 708 may be configured so that the transmitting device compares one or two items of the encoding rate and the modulation scheme to condition values, which deteriorate convergence characteristics of an iterative process in turbo equalization, corresponding to each item, and a constraint length is determined from the comparison result.

In addition, as another method of determining the constraint length of the component encoder, the encoding method determination section 708 may be configured to make the determination from only the correlation value between the antennas.

Further, an example in which the constraint length of only one component encoder is made short to improve the convergence characteristics in the determination of the constraint length has been described in this embodiment. However, in the case of a short constraint length of for example, 3, when the two component encoders use the same constraint length, the encoding method determination section 708 may be configured so that the constraint length of only one component encoder is made long and different constraint lengths are used in the two component encoders.

As described above, the receiver using an iterative process such as turbo equalization can improve convergence characteristics by configuring the component encoders within the turbo encoding section in different constraint lengths when the encoding rate is high and/or when the correlation value between the antennas is high or in an environment in which the convergence characteristics of the iterative process in the turbo equalization become bad such as when the number of modulation order is greater than or equal to a constant value by applying this embodiment, and can improve frequency utilization efficiency.

Third Embodiment

Figure 16:
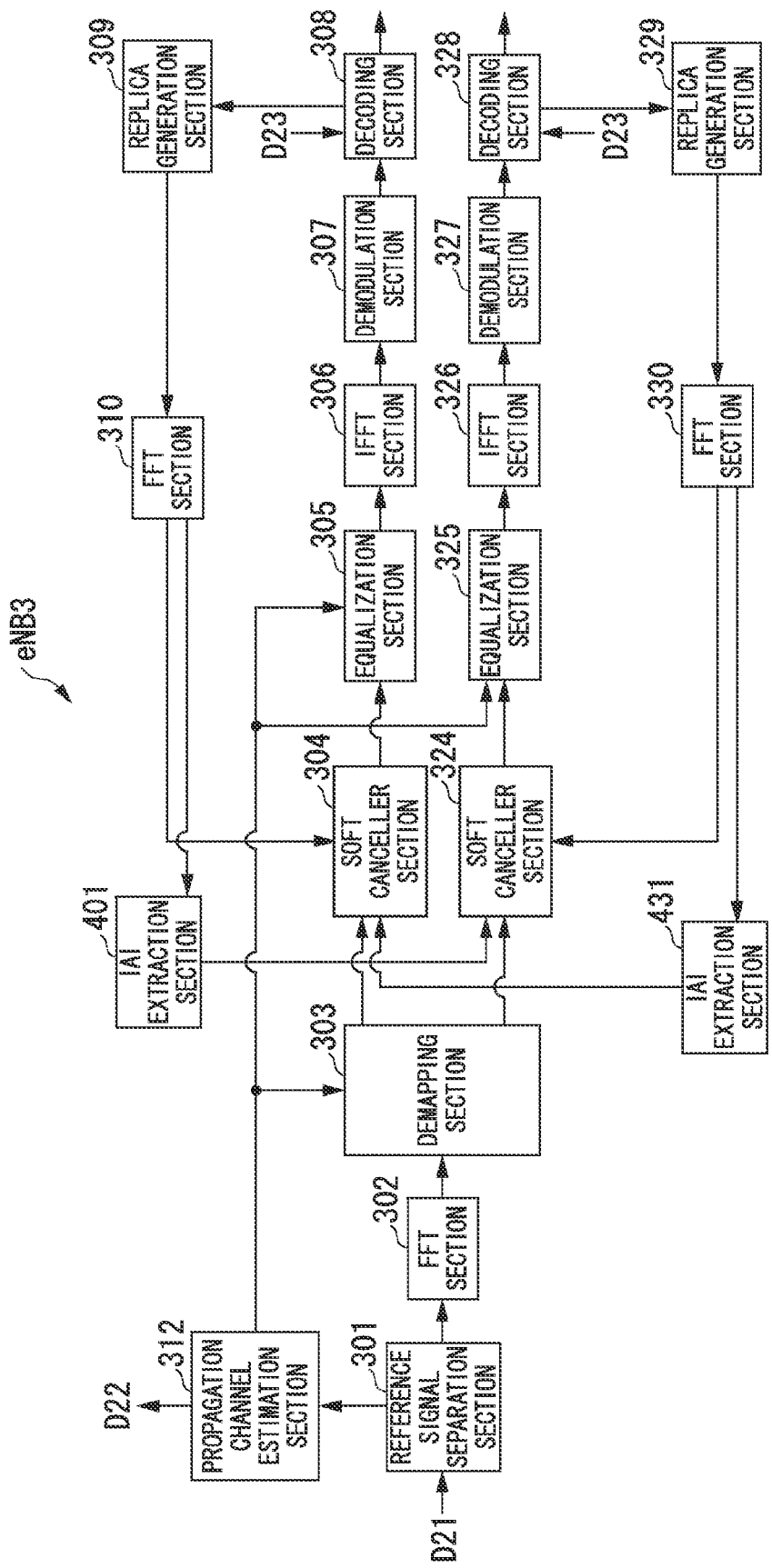
FIG. 16 is a block diagram illustrating a configuration example of a receiving device of a base station device eNB3 according to the third embodiment of the present invention.

In the third embodiment, a transmitting device performs transmission by multiple antennas, and allocates subcarriers having a high propagation gain to each antenna. When only some subcarriers overlap and a receiving device uses an iterative process such as turbo equalization, convergence characteristics are improved by configuring component encoders within a turbo encoding section in different convergence lengths in an environment in which convergence characteristics of the iterative process in the turbo equalization are bad such as when an encoding rate and/or multi-value modulation is high and when a correlation value between antennas is high. This configuration example will be described using FIG. 16. FIG. 16 is a diagram illustrating a configuration example of a receiving device of a base station device eNB3 according to this embodiment.

Figure 15:
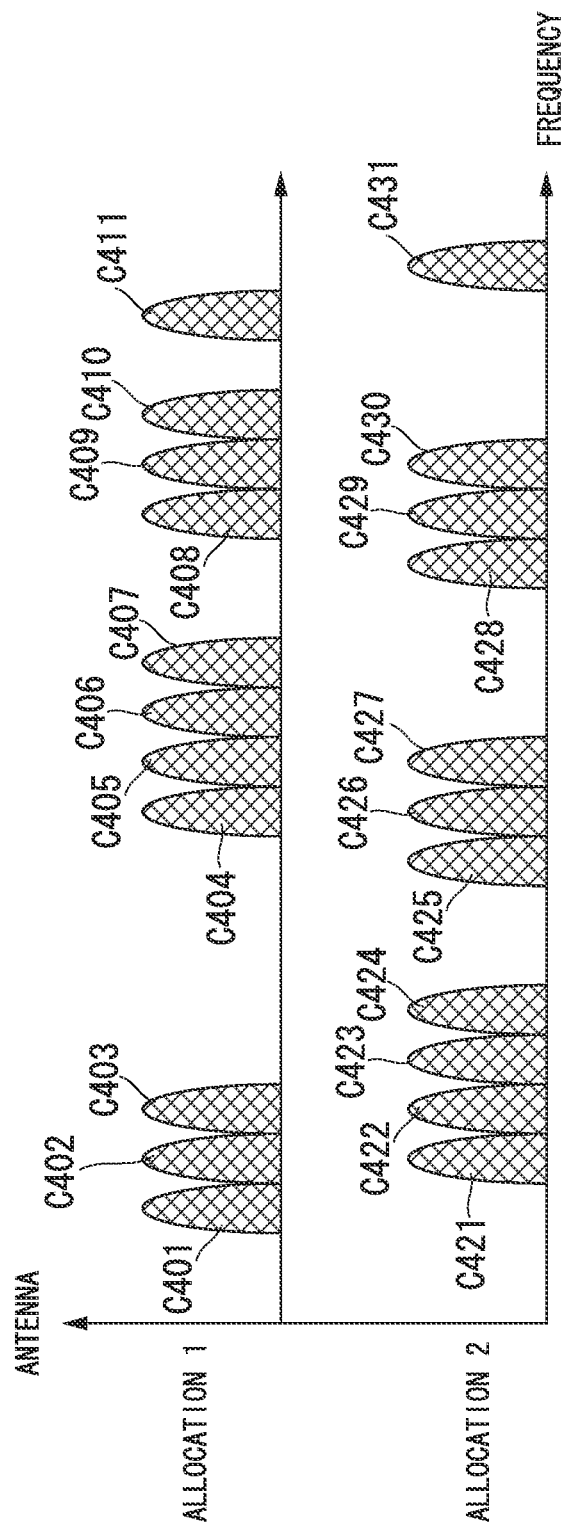
FIG. 15 is a diagram illustrating an example in which bands are allocated for each antenna according to a third embodiment.

FIG. 15 illustrates an example in which bands are allocated to each antenna of this embodiment. Although the same band is allocated to each antenna in the second embodiment, the allocation of a different band to each antenna is possible in this embodiment.

The upper drawing (allocation 1) of FIG. 15 illustrates allocation of an antenna T1. Here, subcarriers C401 to C411 are allocated to the antenna T1. The lower drawing (allocation 2) of FIG. 15 illustrates allocation to an antenna T2. Here, subcarriers C421 to C431 are allocated to the antenna T2.

In this case, the configuration of the transmitting device (terminal device) is substantially the same as in FIG. 10. In addition, as shown in FIG. 16, the receiving device is substantially the same, except that IAI extraction sections 401 and 431 are provided instead of the IUI extraction sections 311 and 331. Each of the IAI extraction sections 401 and 431 generates an IAI replica to be used for removal of IAI (inference from another antenna).

Here, the IAI extraction section 401 generates the IAI replica from feedback information input from the FFT section 310, and outputs the IAI replica to the soft canceller section 324. Likewise, the IAI extraction section 431 generates the IAI replica from feedback information input from the FFT section 330, and outputs the IAI replica to the soft canceller section 304.

In addition, a method of determining a constraint length of each component encoder within the turbo encoding section in the encoding method determination section 107 is determined by the flowchart of FIG. 7 as in the first embodiment.

In this embodiment, the constraint length of each component encoder within the turbo encoding section is changed in consideration of interference by IAI and ISI. However, the present invention is applicable when interference is suppressed according to an iterative process such as turbo equalization even when there is interference not disclosed in this embodiment.

In addition, although uplink in which the transmitting device is UE1 and the receiving device is a base station device eNB3 has been described, the present invention is also applicable to downlink.

In addition, although the number of antennas has been described to be 2, the present invention is also similarly applicable to the case of three or more antennas.

In addition, although an example in which a transmission scheme is based on a single carrier and turbo equalization is applied to a reception process has been described, the present invention is applicable when the receiving device performs an iterative process of an interference canceller and a decoding section even for multi-carrier as in the first embodiment.

In addition, in the encoding method determination section 107 of this embodiment, a constraint length of each component encoder is determined according to a comparison process illustrated in FIG. 7 with condition values, which deteriorate an iterative process in turbo equalization, corresponding to items based on communication parameters including the items such as an encoding rate, a modulation scheme (number of modulation order), and an overlapping rate of band allocation with other communication devices as in the first embodiment. The receiving device side may determine the constraint length for each component encoder of each transmitting device and report the determination result as control information to the transmitting device.

In addition, the receiving device does not report an overlapping rate of the band to the transmitting device, and the encoding method determination section 107 may be configured so that the transmitting device compares one or two items of the encoding rate and the modulation scheme to condition values, which deteriorate convergence characteristics of an iterative process in turbo equalization, corresponding to the items, and a constraint length is determined from the comparison result.

In addition, as another method of determining the constraint length of the component encoder, the encoding method determination section 107 may be configured to make the determination from only the band overlapping rate.

Further, an example in which the constraint length of only one component encoder is made short to improve the convergence characteristics in the determination of the constraint length has been described in this embodiment. However, in the case of a short constraint length of for example, 3, when the two component encoders use the same constraint length, a configuration may be made so that the constraint length of only one component encoder is made long in contrast to this embodiment and different constraint lengths are used in the two component encoders.

As described above, the receiver using an iterative process such as turbo equalization can improve convergence characteristics by configuring the component encoders within the turbo encoding section in different constraint lengths when the encoding rate is high and/or when the overlapping rate of band allocation is high or even in an environment in which the convergence characteristics of the iterative process in the turbo equalization become bad such as when the number of modulation order is greater than or equal to a constant value by applying this embodiment, and can improve frequency utilization efficiency.

Fourth Embodiment

In the fourth embodiment, an example in which convergence characteristics are improved by configuring component encoders within a turbo encoding section in different constraint lengths in an environment in which the number of reception antennas of a receiving device is small and the convergence characteristics of an iterative process such as turbo equalization are bad when the receiving device uses the iterative process such as the turbo equalization in a wireless communication system including a transmitting device and a receiving device of one of the first to third embodiments will be described. Here, the case in which a base station device eNB (FIG. 6) is used will be described.

In this embodiment, the base station device eNB notifies terminal devices UE2 and UE3 (or UE1), which are transmitting devices, of control information in which the number of antennas in the receiving device is added to information such as an encoding rate, number of modulation order, and band allocation information (or a correlation value between antennas). Because constraint-length control processes in the encoding method determination sections 107 and 708 are substantially the same as each other, an example of the encoding method determination section 107 will be described.

Figure 17:
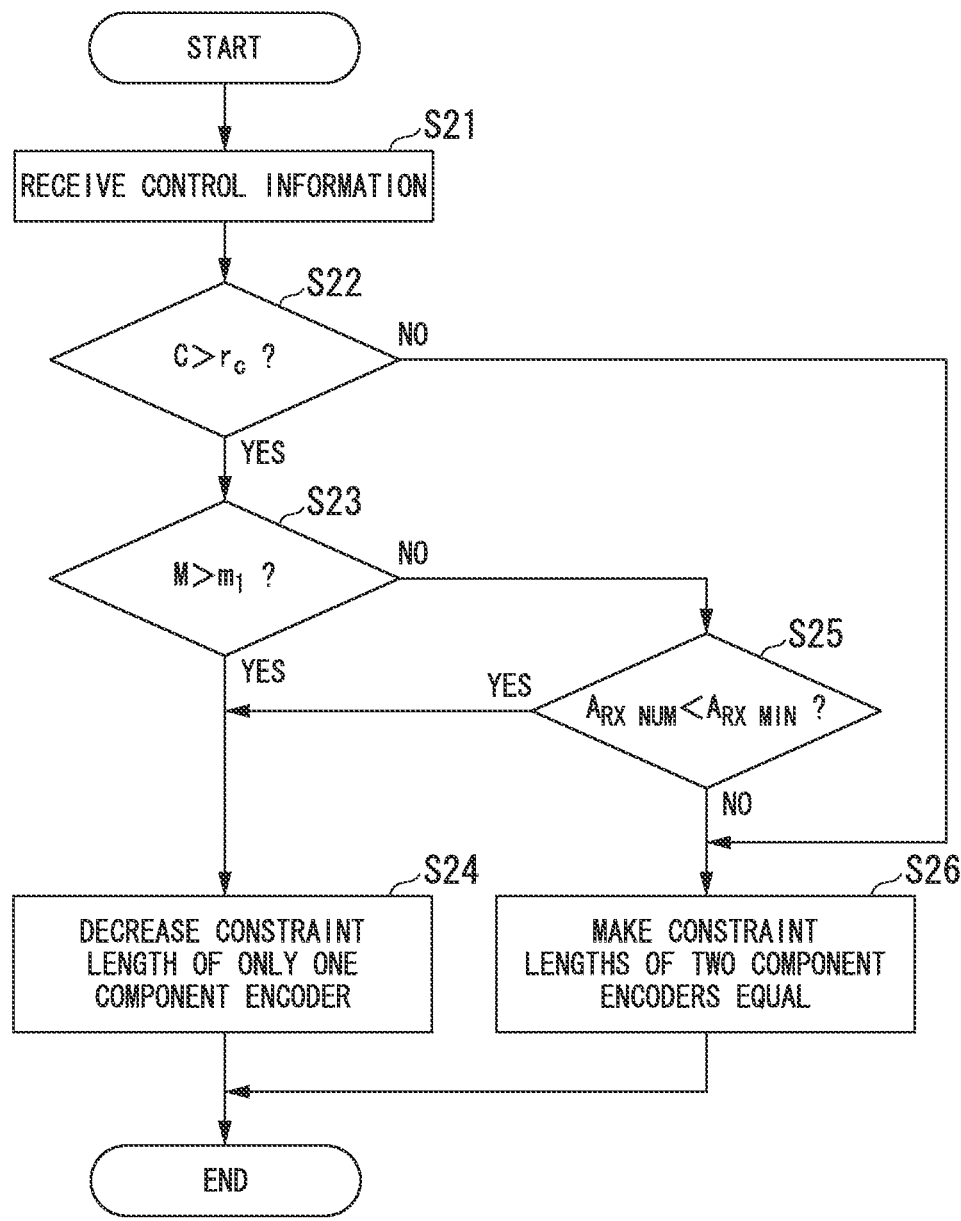
FIG. 17 is a flowchart illustrating an operation example of a process in which an encoding method determination section(s) 107 (and 708) controls a constraint length according to a fourth embodiment of the present invention.

FIG. 17 is a flowchart illustrating an operation example of the constraint-length control process to be performed by the encoding method determination section(s) 107 (and 708).

Step S21:

The control information reception section 108 receives control information reported from the receiving device of the base station device eNB, and outputs the received control information to the encoding method determination section 107. In control information reported from the receiving device, an encoding rate is denoted by C, number of modulation order is denoted by M, and the number of antennas is denoted by $A_{RX\,NUM}$.

Step S22:

The encoding method determination section 107 determines whether or not the encoding rate C included in the received control information is higher than a threshold value $r_c$, which is a high encoding rate at which convergence characteristics become bad (whether or not $C > r_c$).

At this time, when the encoding rate C exceeds the threshold value $r_c$ ($C > r_c$), the encoding method determination section 107 proceeds to the process of step S23. On the other hand, when the encoding rate C is less than or equal to the threshold value $r_c$ ($C \leq r_c$), the encoding method determination section 107 determines that it is not necessary to improve convergence characteristics by changing the constraint length, and proceeds to the process of step S26.

Step S23:

The encoding method determination section 107 determines whether or not the reported number M of modulation order is larger than the order $m_1$ for which convergence characteristics are bad (whether or not $M > m_1$).

At this time, when the number M of modulation order exceeds the order $m_1$ ($M > m_1$), the encoding method determination section 107 determines that the convergence characteristics are bad, and proceeds to the process of step S24. On the other hand, when the number M of modulation order is less than or equal to the order $m_1$ ($M \leq m_1$), the encoding method determination section 107 proceeds to the process of step S25.

Step S24:

The encoding method determination section 107 decreases a constraint length of one of the encoding sections 201 and 204. Thereby, the convergence characteristics of a turbo decoding process are improved.

The encoding method determination section 107, for example, decreases the constraint length in the encoding section 204 by 1 from a constraint length of 4 to a constraint length of 3, and outputs the obtained constraint length to the encoding section 204. The encoding section 204 changes a configuration of an internal logical operation circuit so that the constraint length of the component encoder is changed in correspondence with the constraint length input from the encoding method determination section 107. In the change in the constraint length, for example, the encoding section 204 changes a configuration of connections of the delay circuits and the adders as illustrated in FIGS. 5A and 5B. Alternatively, RSC encoders illustrated in FIGS. 5A and 5B are provided within encoding sections, that is, the encoding section has a plurality of RSC encoders having different constraint lengths. The encoding section changes an RSC encoder to be used for generating an error-correcting code according to a constraint length from the encoding method determination section 107. Here, a constraint length of one encoding section to be changed or a degree of a change in the constraint length is preset inside the encoding method determination section 107.

Step S25:

The encoding method determination section 107 determines whether the number of reception antennas, $A_{RX\,NUM}$, reported from the receiving device is less than or different from the threshold number of reception antennas, $A_{RX\,MIN}$, at which convergence characteristics become bad (whether or not $A_{RX\,NUM} < A_{RX\,MIN}$).

At this time, when the number of reception antennas, $A_{RX\,NUM}$, is less than the threshold value $A_{RX\,MIN}$ ($A_{RX\,NUM} < A_{RX\,MIN}$), the encoding method determination section 107 determines that the convergence characteristics are bad, and proceeds to the process of step S24. On the other hand, when the number of reception antennas, $A_{RX\,NUM}$, is greater than or equal to the threshold value $A_{RX\,MIN}$ ($A_{RX\,NUM} \geq A_{RX\,MIN}$), the encoding method determination section 107 determines that it is not necessary to improve the convergence characteristics by changing the constraint length, and proceeds to the process of step S26.

Step S26:

Because it is not necessary to improve the convergence characteristics by changing the constraint length in the encoding method determination section 107, the two component encoders of the encoding sections 201 and 204 use the same constraint length. For example, the encoding method determination section 107 sets the constraint length of each of the encoding sections 201 and 204 to 4 and ends a constraint-length control process.

In addition, because the determination of the constraint length using threshold values $r_c$, $m_1$, and $A_{RX\,MIN}$ used in the flowchart illustrated in FIG. 17 is also required for the receiver, the same values for the three parameters are predetermined in both the transmitting device and the receiving device. Like the first embodiment, this embodiment is applicable to any of the downlink and uplink.

In this embodiment, the case in which the number of reception antennas is small in an environment in which convergence characteristics of an iterative process in turbo equalization are bad has been described. However, the present invention is applicable to any case because the convergence characteristics of the iterative process in the turbo equalization become bad under a communication environment in which interference is strong such as when a delayed wave exceeding a CP length is reached, when inter-cell interference is much and/or frequency selectivity is strong, when there is a large difference between transmission timings of a plurality of transmitting devices within a cell in the uplink, and when a frequency offset is large.

It is possible to improve convergence characteristics and improve frequency utilization efficiency by configuring the component encoders within the turbo encoding section in different constraint lengths in an environment in which the number of reception antennas is small and the convergence characteristics of the iterative process in the turbo equalization become bad.

In addition, in the encoding method determination section 107 of this embodiment, a constraint length of each component encoder is determined according to a process illustrated in FIG. 17 based on an encoding rate, a modulation scheme (number of modulation order), the number of reception antennas of the receiving device, and the like as in the first embodiment. The receiving device side may determine the constraint length for each component encoder of each transmitting device and report the determination result as control information to the transmitting device.

In addition, the number of reception antennas is not reported to the transmitting device, and the encoding method determination section 107 may be configured so that a comparison to condition values, which deteriorate convergence characteristics of an iterative process in turbo equalization of corresponding items, is performed from information regarding one or two items of communication parameters of the encoding rate and the modulation scheme, and the constraint length is determined to be long when the determination result indicates that the convergence characteristics are deteriorated.

In addition, as another method of determining the constraint length of the component encoder, the encoding method determination section 107 may be configured to make the determination from only the number of reception antennas.

Fifth Embodiment

An example in which convergence characteristics are improved by applying a turbo code of a short constraint length to error correction in consideration of a calculation amount of a decoding process when a receiving device uses an iterative process such as turbo equalization and applying a turbo code of a long constraint length to error correction in an environment in which the iterative process in the turbo equalization having much interference does not exactly converge in a wireless communication system including a transmitting device and a receiving device of one of the first to fourth embodiments will be described in the fifth embodiment. Hereinafter, an example will be described with reference to the first embodiment.

That is, in the transmitting device of this embodiment, the encoding method determination section 107 determines the constraint length according to the following process in consideration of the calculation amount of the decoding process in the receiving device.

The propagation channel estimation section 312 obtains estimated values of propagation channel characteristics by estimating the propagation channel characteristics, sets an encoding rate, a modulation scheme (number of modulation order), an overlapping rate, and band allocation information from the estimated values, and transmits the setting results as control information to the transmitting device (terminal device UE).

The encoding method determination section 107 determines whether or not each of the encoding rate, the modulation scheme (number of modulation order), and the overlapping rate is higher than a preset threshold value indicating that the iterative process in the turbo equalization in which interference is small is under an environment in which convergence is accurate and easy.

When all of the encoding rate, the modulation scheme (number of modulation order), and the overlapping rate are lower compared to threshold values, the encoding method determination section 107 sets all the component encoders within the turbo encoding section 101 to a preset short constraint length, for example, a constraint length of 3, and hence error-correcting encoding is performed.

On the other hand, when one of the encoding rate, the modulation scheme number of modulation order), and the overlapping rate is greater than or equal to the threshold value, the encoding method determination section 107 increases the constrain length of one of the encoding sections 201 and 204 within the turbo encoding section 101, for example, from a constraint length of 3 to a constraint length of 4.

That is, in this embodiment, there is an environment in which a certain stuck situation is likely to occur in a state in which an iterative process in turbo equalization does not accurately converge when an overlapping rate at which an overlapping band is allocated to a plurality of transmitting devices or antennas is high and/or when interference becomes much such as when a correlation value between antennas is large in MIMO transmission, when the number of reception antennas from which sufficient reception power is not obtained is small, and the like. Thus, the transmitting device uses a turbo code ranging from a short constraint length to a long constraint length for error correction so as to facilitate accurate convergence in consideration of convergence characteristics of the iterative process in the turbo equalization.

In addition, likewise, a turbo code of a long constraint length may be used even when the number of modulation order is large and/or when the encoding rate is high. Here, the receiving device may report an overlapping rate of the band and/or a correlation value between antennas and the number of reception antennas, and the encoding determination section of the transmitting device may determine the constraint length. Constraint lengths of the component encoders within the turbo encoding section may be determined by the receiving device and reported to the transmitting device. Likewise, the constraint length may be changed under an environment in which interference becomes much in addition to interference described in this embodiment.

By applying this embodiment, a constraint length of one component encoder is made long under an environment in which an amount of interference at which convergence characteristics becomes bad increases when constraint lengths of a plurality of component encoders within the turbo encoding sections 101 and 701 are short in consideration of convergence characteristics of a receiver using an iterative process such as turbo equalization and a calculation amount of a decoding process. Thereby, the convergence characteristics can be improved while a significant increase from a low calculation amount is suppressed, and frequency utilization efficiency can be improved.

A program operating in the transmitting device and the receiving device according to the embodiments of the present invention is a program that controls a central processing unit (CPU) or the like (a program that causes a computer to function) to implement the transmitting device and the receiving device according to the embodiments of the present invention. Information handled in the devices is temporarily accumulated in a random access memory (RAM) upon processing, subsequently stored in various read only memories (ROMs) and/or hard disk drives (HDDs), and read and corrected/written by the CPU as necessary. As a recording medium to record the program thereon, there may be provided any one of a semiconductor medium (for example, a ROM, a nonvolatile memory card, or the like), an optical recording medium (for example, a digital versatile disk (DVD), a magneto-optical disc (MO), a mini disc (MD), a compact disc (CD), a Blu-ray disc (BD), or the like), and a magnetic recording medium (for example, a magnetic tape, a flexible disc, or the like).

In addition, the functions of the above-described embodiments may be implemented by executing the loaded program, and the functions of the transmitting device and the receiving device according to the embodiments of the present invention may be implemented by performing processing in cooperation with an operating system, another application program, or the like based on an instruction of the program. The program can be stored and distributed in a portable recording medium when distributed on the market or transmitted to a server computer connected via a network such as the Internet. In this case, a storage device of the server computer is also included in the present invention.

In addition, all or part of the transmitting device and the receiving device in the above-described embodiments may be implemented as large scale integration (LSI), which is a typical integrated circuit. Each functional block of the transmitting device and the receiving device may be implemented by a separated chip, and all or part may be integrated and implemented by a chip.

In addition, a technique of an integrated circuit may be implemented by a dedicated circuit or a general-purpose processor as well as LSI. In addition, when technology of an integrated circuit, which is a substitute for LSI, appears with the development of semiconductor technology, an integrated circuit by the above-described technology can be used.

Although the embodiments of the present invention have been described above with reference to the drawings, specific configurations are not limited to these embodiments, and design changes and the like are also included without departing from the scope of the present invention.

INDUSTRIAL APPLICABILITY

The present invention is applicable to a wireless communication system, a communication device, a program, an integrated circuit, and the like capable of improving reliability of communication according to modulation/demodulation parameters and/or communication schemes, propagation channels and the like using a turbo code for an error-correcting code.

REFERENCE SYMBOLS

101, 701: Turbo encoding section
102, 703, 713: Modulation section
103, 302, 310, 330: FFT section
104, 705, 715: Mapping section
105, 306, 326, 706, 716, 806, 826: IFFT section
106, 707, 717: Reference signal multiplexing section
107, 708: Encoding method determining section
108, 709: Control information reception section
201, 204: Encoding section
202: Puncturing section
203: Interleaving section
205: Encoded bit output section
204-11, 204-12, 204-13: Delay circuit
204-21, 204-22, 204-23, 204-24: Adder
204-31, 204-32: Delay circuit
204-41, 204-42, 204-43: Adder
301, 801, 821: Reference signal separation section
704, 714, 802, 812, 822, 832: FFT section
303, 803, 823: Demapping section
304, 324, 804, 824: Soft canceller section
305, 325: Equalization section
307, 327, 807, 827: Demodulation section
308, 328, 809: Decoding section
309, 329, 811, 831: Replica generation section
311, 331: IUI extraction section
312, 813: Propagation channel estimation section
351, 352: Signal detection section
401, 431: IAI extraction section
702, 810: S/P section
805: MIMO separation section
808: P/S section
UE1, UE2, UE3: Terminal device
eNB, eNB1, eNB2, eNB3: Base station device

The invention claimed is:

1. A wireless communication system comprising a first communication device,
   wherein the first communication device comprises:
   a plurality of component encoders; and
   a turbo encoding section that configures the plurality of component encoders in different constraint lengths in case that a second communication device performs a signal reception process by turbo equalization,
   wherein the turbo encoding section is configured to compare at least one communication parameter to at least one condition value, the at least one communication parameter being set by the second communication device according to propagation characteristics of a signal received from the first communication device, the at least one condition value deteriorating convergence characteristics of an iterative process in the turbo equalization set for the at least one communication parameter, and
   the plurality of the component encoders are configured in the different constraint lengths according to comparison result by the turbo encoding section.

2. The wireless communication system according to claim 1,
   wherein constraint length of one of the plurality of the component encoders constituting the turbo encoding section is changed.

3. The wireless communication system according to claim 1,
   wherein, in case that one of the at least one communication parameter corresponds to the at least one condition value, constraint length of one of the plurality of the component encoders within the turbo encoding section is changed.

4. The wireless communication system according to claim 1,
   wherein, in case that the second communication device allows an overlapping allocated band to a plurality of communication devices including the first communication device and performs a decoding process for the received transmission signal according to the iterative process in the turbo equalization,
   the second communication device is configured to determine control information including allocated frequency bands for every plurality of the communication devices, an encoding rate, the number of modulation order of a modulation symbol, and the number of reception antennas to be used by the second communication device, the second communication device is configured to report all or some of the at least one communication parameter including the control information and overlapping rates of overlapping bands allocated for every plurality of the communication devices to the first communication device, and the first communication device is configured to perform encoding using the turbo encoding section in which the plurality of the component encoders are configured in the different constraint lengths by comparing the reported at least one communication parameter to the at least one condition value.

5. The wireless communication system according to claim 1, wherein, in case that the first communication device transmits a spatially multiplexed signal to the second communication device using a plurality of transmission antennas, and the second communication device performs separation of the spatially multiplexed signal using a plurality of reception antennas and a reception process by turbo equalization, the second communication device is configured to determine control information including allocated bands for every of the plurality of the transmission antennas, an encoding rate, the number of modulation order, a correlation value between the plurality of the transmission antennas and the plurality of the reception antennas, and the number of the plurality of the reception antennas, the correlation value being calculated from propagation channel estimation for every of the plurality of the transmission antennas and the plurality of the reception antennas, and transmit the control information to the first communication device, and the first communication device is configured to determine the different constraint lengths of the plurality of the component encoders of the turbo encoding section by comparing all or some of the at least one communication parameter of the control information to the at least one condition value with the corresponding at least one communication parameter, and the plurality of the component encoders in the turbo encoding section is configured to use the different constraint lengths.

6. The wireless communication system according to claim 1, wherein, in case that an encoding rate is greater than a predetermined value, the different constraint lengths of the plurality of the component encoders of the encoding section are changed.

7. A communication device comprising:
a plurality of component encoders;
a turbo encoding section configured to encode information bits by the plurality of the component encoders, the encoding being performed by inserting a plurality of error-correcting codes into the information bits in case that the communication device transmits, to another communication device, the information bits as a transmission signal; and a determination section configured to decide so as to make a constraint length of one of the plurality of the component encoders short based on first information and second information, the first information being at least one communication parameter used by the communication device to transmit the information bits, the second information being an overlapping rate of band.

8. The communication device according to claim 7, wherein, in case that the another communication device allows an overlapping allocated band to a plurality of communication devices and performs a reception process by a turbo equalization process, the plurality of the component encoders within the turbo encoding section have the different constraint lengths.

9. The communication device according to claim 7, wherein, in case that the another communication device determines allocated bands for every of a plurality of transmission antennas provided in the communication device, allows an overlapping allocated band to the plurality of the transmission antennas, and performs a reception process by a turbo equalization process, the plurality of the component encoders within the turbo encoding section have the different constraint lengths.

10. The communication device according to claim 7, wherein the at least one communication parameter set by the another communication device is compared to at least one condition value, the at least one condition value deteriorating convergence characteristics of an iterative process in turbo equalization in the communication device, the at least one condition value being set for the at least one communication parameter according to propagation characteristics of a signal received from the another communication device, and the different constraint lengths of the plurality of the component encoders are changed according to comparison result.

11. The communication device according to claim 7, wherein all or some of the at least one communication parameter including band allocation information, a modulation scheme, an encoding rate, the overlapping rate of the band, a correlation value between antennas, and the number of reception antennas are reported from the another communication device, the different constraint lengths of the plurality of the component encoders in the turbo encoding section are determined based on third information regarding the reported at least one communication parameter, and turbo encoding is performed.

* * * * *